(12) United States Patent
Yamamoto et al.

(10) Patent No.: US 9,121,515 B2
(45) Date of Patent: Sep. 1, 2015

(54) GATE VALVE UNIT, SUBSTRATE PROCESSING DEVICE AND SUBSTRATE PROCESSING METHOD THEREOF

(75) Inventors: Kaoru Yamamoto, Yamanashi (JP); Masamichi Hara, Yamanashi (JP); Tetsuya Miyashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 60 days.

(21) Appl. No.: 14/005,461

(22) PCT Filed: Mar. 6, 2012

(86) PCT No.: PCT/JP2012/055711
§ 371 (c)(1),
(2), (4) Date: Sep. 16, 2013

(87) PCT Pub. No.: WO2012/128029
PCT Pub. Date: Sep. 27, 2012

(65) Prior Publication Data
US 2014/0003892 A1  Jan. 2, 2014

(30) Foreign Application Priority Data

Mar. 18, 2011  (JP) ................. 2011-061636

(51) Int. Cl.
*H01L 21/677*  (2006.01)
*F16K 3/30*  (2006.01)
(Continued)

(52) U.S. Cl.
CPC . *F16K 3/30* (2013.01); *B65G 49/00* (2013.01); *C23C 14/566* (2013.01); *C23C 16/4401* (2013.01); *F16K 3/0227* (2013.01); *F16K 3/182* (2013.01); *F16K 51/02* (2013.01); *H01L 21/28556* (2013.01); *H01L 21/67126* (2013.01); *H01L 21/76841* (2013.01); *C23C 16/16* (2013.01)

(58) Field of Classification Search
CPC ... F16K 51/02; C23C 16/4409; C23C 14/566; C23C 16/4401
USPC .......................................... 414/217; 251/157
See application file for complete search history.

(56) References Cited

U.S. PATENT DOCUMENTS 5,769,952 A * 6/1998 Komino ................... 118/733
6,095,741 A * 8/2000 Kroeker et al. ........... 414/217
(Continued)

FOREIGN PATENT DOCUMENTS

JP  60 37139  2/1985
JP  5 196150  8/1993
(Continued)

OTHER PUBLICATIONS

International Search Report Issued Jun. 12, 2012 in PCT/JP12/55711 Filed Mar. 6, 2012.

*Primary Examiner* — Saul Rodriguez
*Assistant Examiner* — Mark Hageman
(74) *Attorney, Agent, or Firm* — Oblon, McClelland, Maier & Neustadt, L.L.P.

(57) ABSTRACT

A substrate processing device includes a depressurizable hot wall chamber having a sidewall with a temperature which becomes higher than room temperature and a first substrate transferring port provided in the sidewall, a depressurizable transfer chamber having a transfer arm mechanism and a second substrate transferring port, and a gate valve unit provided between the hot wall chamber and the transfer chamber. The gate valve unit includes: a housing having a sidewall provided with communicating holes, a first housing substrate transferring port, and a second housing substrate transferring port; a valve body which is elevatable in the housing; and a double sealing structure having a first sealing member and a second sealing member provided at an outer side of the first sealing member. The communicating holes communicate a gap between the first sealing member and the second sealing member with an internal space of the housing.

7 Claims, 19 Drawing Sheets

(51) Int. Cl.
*F16K 51/02* (2006.01)
*H01L 21/67* (2006.01)
*C23C 16/44* (2006.01)
*H01L 21/285* (2006.01)
*H01L 21/768* (2006.01)
*B65G 49/00* (2006.01)
*F16K 3/02* (2006.01)
*C23C 14/56* (2006.01)
*F16K 3/18* (2006.01)
*C23C 16/16* (2006.01)

(56) References Cited

U.S. PATENT DOCUMENTS

| | | | |
|---|---|---|---|
| 6,433,308 B1 * | 8/2002 | Ishigaki et al. | 219/201 |
| 6,561,484 B2 * | 5/2003 | Nakagawa et al. | 251/175 |
| 6,913,243 B1 * | 7/2005 | Tomasch | 251/167 |

FOREIGN PATENT DOCUMENTS

| | | |
|---|---|---|
| JP | 5 272662 | 10/1993 |
| JP | 6 247460 | 9/1994 |
| JP | 7 198063 | 8/1995 |
| JP | 8 13149 | 1/1996 |
| JP | 9 79388 | 3/1997 |
| JP | 11 315940 | 11/1999 |
| JP | 2001 324032 | 11/2001 |
| JP | 2001 330172 | 11/2001 |
| JP | 2004 225878 | 8/2004 |
| JP | 2004 319871 | 11/2004 |
| JP | 2006 124792 | 5/2006 |
| JP | 2009 115242 | 5/2009 |

* cited by examiner

GATE VALVE UNIT, SUBSTRATE PROCESSING DEVICE AND SUBSTRATE PROCESSING METHOD THEREOF

FIELD OF THE INVENTION

The present invention relates to a gate valve unit provided between a processing chamber and a transfer chamber configured to perform a processing process for a substrate such as a semiconductor wafer, a liquid crystal substrate, a solar cell panel substrate or the like, a substrate process device including the gate valve unit, and a substrate processing method thereof.

BACKGROUND OF THE INVENTION

In a manufacture process of a semiconductor apparatus, there is a need to transfer a substrate such as a semiconductor wafer or the like between chambers having pressure atmospheres with different vacuum degrees. The transferring of the substrate is performed through substrate transferring ports provided in sidewalls of the chambers after pressure is adjusted so as to reduce a difference in pressure among the respective chambers. In order to hermetically seal the substrate transferring ports before and after the transferring of the substrate, a gate valve unit is provided between the chambers (see, for example, Patent Document 1).

Patent Document 1 discloses a gate valve unit provided between a process chamber for performing a substrate processing process and a transfer chamber for transferring a substrate. In the gate valve, one sealing member is provided between each chamber and the gate valve unit to surround a substrate transferring port so that the substrate transferring port can be hermetically sealed to prevent air from entering.

However, since the sealing member provided in the gate valve unit is composed of, e.g., an O-ring made of fluorine-based resin, a sealing function is deteriorated when the sealing member is heated, which allows air to penetrate. Particularly, in case of a hot wall chamber, a sidewall of the chamber is heated which performing film formation processing or annealing by heating the substrate within the process chamber. In that case, since the heat of the sidewall is transmitted to the gate valve unit, even the sealing member of the transfer chamber as well as the sealing member of the process chamber is heated, which deteriorates the sealing function.

Like this, if the sealing member allows air to penetrate, the air enters the interior of the chamber through the substrate transferring port to increase pressure in the chamber, which causes such a problem that a target degree of vacuum cannot be maintained. In this case, when a vacuum degree of the chamber is low (when pressure in the chamber is high), a variation in pressure may be ignored, but at pressure lower than, e.g., a $10^{-6}$ Torr order, as the vacuum degree increases (as the pressure is lowered), an amount of the air that penetrates through the sealing member increases, and a variation in pressure in the chamber may not be ignored. Furthermore, when a temperature of the O-ring heated at pressure lower than a $10^{-7}$ Torr order exceeds room temperature, the pressure in the chamber may not be maintained even at a relatively low temperature equal to or less than 100° C.

Meanwhile, Patent Document 2 discloses a sealing structure applied to an airtight processing container for introducing corrosive gas and a cover capable of opening and closing the container, wherein the sealing structure is configured to be double sealed with a first sealing member covered by a metal surface and an outer second sealing member composed of an O-ring made of a rubber material because when only one sealing member is used, it may be easily deteriorated due to the corrosive gas, and a communication hole for communicating a gap between the sealing members with the interior of the processing container is provided, thereby reducing the deterioration of the sealing members.

However, since the double sealing members disclosed in Patent Document 2, which are applied to one airtight processing container (process chamber) and the cover, are different from a gate valve unit provided between two chambers as disclosed in Patent Document 1 with respect to the configuration and condition thereof, the double sealing members may be completely applied to a process chamber. Although the double sealing members are applied to the process chamber, a sealing function thereof is deteriorated, thereby still failing to prevent air from entering the interior of a transfer chamber. Furthermore, the communicate hole provided between the first and second sealing members is intended to prevent the deterioration of the first and second sealing members resulting from the entry of corrosive gas into the gap between the first and second sealing members by maintaining pressure in the gap between the first and second sealing members to be equal to that in the processing container, but is not intended to maintain the pressure of the container itself.

[Patent Document 1] Japanese Patent Application Publication No. 2001-324032

[Patent Document 2] Japanese Patent Application Publication No. H06-247460

SUMMARY OF THE INVENTION

Accordingly, the present invention has been made keeping in mind the above problems occurring in the related art. An aspect of the present invention provides a substrate processing device which is configured such that although sealing members for sealing a substrate transferring port are heated, the air is prevented from entering the interior of one chamber required to maintain a higher degree of vacuum than that of the other chamber from the sealing members so that the interior of the one chamber can be maintained at a predetermined pressure vacuum.

In accordance with a first aspect of the present invention, there is provided a substrate processing device, including: a depressurizable hot wall chamber having a sidewall with a temperature which becomes higher than room temperature and a first substrate transferring port provided in the sidewall; a depressurizable transfer chamber having a transfer arm mechanism for transferring a substrate to and from the hot wall chamber and a second substrate transferring port; and a gate valve unit provided between the hot wall chamber and the transfer chamber, wherein the gate valve unit includes: a housing having a sidewall provided with communicating holes, a first housing substrate transferring port corresponding to the first substrate transferring port, and a second housing substrate transferring port corresponding to the second substrate transferring port; a valve body which is movable up and down in the housing; and a double sealing structure having a first sealing member and a second sealing member provided at an outer side of the first sealing member, and wherein the communicating holes allow a gap between the first sealing member and the second sealing member to communicate with an internal space of the housing, the first sealing member and the second sealing member are provided between the sidewall of one of the hot wall chamber and the transfer chamber, which is required to maintain a higher vacuum degree than that of the other chamber, and the sidewall of the housing, and the substrate transferring port of the one chamber is surrounded by the first sealing member and the second sealing member and is opened and closed by the valve body.

In accordance with a second aspect of the present invention, there is provided a gate valve unit, which is adapted to be provided between a depressurizable hot wall chamber having a sidewall with a temperature which becomes higher than room temperature and a first substrate transferring port provided in the sidewall, and a depressurizable transfer chamber having a transfer arm mechanism for transferring a substrate to and from the hot wall chamber and a second substrate transferring port, the gate valve unit including: a housing having a sidewall provided with communicating holes, a first housing substrate transferring port corresponding to the first substrate transferring port, and a second housing substrate transferring port corresponding to the second substrate transferring port; a valve body configured to be movable up and down in the housing; and a double sealing structure having a first sealing member and a second sealing member provided at an outer side of the first sealing member, wherein the communicating holes allow a gap between the first sealing member and the second sealing member to communicate with an internal space of the housing, the first sealing member and the second sealing member are provided between the sidewall of one of the hot wall chamber and the transfer chamber, which is required to maintain a higher degree of vacuum than the other chamber, and the sidewall of the housing, the substrate transferring port of the one chamber is surrounded by the first sealing member and the second sealing member and is opened and closed by the valve body.

The gap between the sealing members may be vacuum-evacuated by the other chamber through the communicating holes by depressurizing the other chamber under a state in which the substrate transferring port of the one chamber is closed by the valve body and the substrate transferring port of the other chamber is opened.

The gate valve unit may further include an elevating shaft mounted to the valve body, a bellows provided to cover a lower portion of the elevating shaft and configured to be stretchable depending on an elevating operation of the elevating shaft, and a bellows heater configured to heat the bellows.

The gate valve unit may further include a valve body restriction member disposed at a position not to block the communicating holes; the valve body includes a main body of the valve body and a valve body supporting part which supports the main body of the valve body by a link mechanism and to which the elevating shaft is mounted; the valve body restriction member restricts an elevating operation of the valve body at a position opposite to the substrate transferring port of the one chamber and moves the main body of the valve body in a direction to make the main body contact with the substrate transferring port of the one chamber through the link mechanism.

In accordance with a third aspect of the present invention, there is provided a substrate processing device, including: a plurality of gate valve units; a plurality of process chambers each having a first substrate transferring port and configured to perform a processing process for a substrate; and a depressurizable transfer chamber having a second transferring port, which is connected to the process chambers via the respective gate valve units and has a transfer arm mechanism configured to transfer the substrate to and from the process chambers, wherein the process chambers include: a depressurizable hot wall chamber having a sidewall with a temperature which becomes higher than room temperature; and a depressurizable high vacuum chamber configured to perform the processing process in a high vacuum atmosphere, at least the gate valve unit placed between the hot wall chamber and the transfer chamber, among the gate valve units, has: a housing having a sidewall provided with communicating holes, a first housing substrate transferring port corresponding to the first substrate transferring port and a second housing substrate transferring port corresponding to the second substrate transferring port; a valve body configured to be movable up and down in the housing; and a double sealing structure having a first sealing member and a second sealing member provided at an outer side of the first sealing member, the communicating holes allow a gap between the first sealing member and the second sealing member to communicate with an internal space of the housing, the first sealing member and the second sealing member are provided between a sidewall of the transfer chamber and the sidewall of the housing, and the second substrate transferring port of the transfer chamber is surrounded by the first sealing member and the second sealing member and is opened and closed by the valve body.

In accordance with a fourth aspect of the present invention, there is provided a substrate processing device, including: a plurality of gate valve units; a plurality of process chambers each having a first substrate transferring port and configured to perform a processing process for a substrate; and a depressurizable transfer chamber having a second transferring port, which is connected to the process chambers via the respective gate valve units and has a transfer arm mechanism configured to transfer the substrate to and from the process chambers, wherein each of the process chambers has a sidewall with a temperature which becomes higher than room temperature, and is a depressurizable hot wall chamber configured to perform the processing process in a high vacuum atmosphere, each of the gate valve units has: a housing having a sidewall provided with communicating holes, a first housing substrate transferring port corresponding to the first substrate transferring port and a second housing substrate transferring port corresponding to the second substrate transferring port; a valve body configured to be movable up and down in the housing; and a double sealing structure having a first sealing member and a second sealing member provided at an outer side of the first sealing member, the communicating holes allow a gap between the first sealing member and the second sealing member to communicate with an internal space of the housing, the first sealing member and the second sealing member are provided between the sidewall of one of each hot wall chamber and the transfer chamber, which is required to maintain a higher vacuum degree than the other chamber, and the sidewall of the housing, and the substrate transferring port of the one chamber is surrounded by the first sealing member and the second sealing member and is opened and closed by the valve body.

According to one embodiment of the present invention, although sealing members for sealing a substrate transferring port are heated, air can be prevented from entering the interior of one chamber required to maintain the higher vacuum degree than that of the other chamber from the sealing members, thereby enabling vacuum pressure in the one chamber to be maintained.

According to one embodiment of the present invention, when one chamber required to maintain the high vacuum degree is depressurized, the substrate transferring port of the one chamber is closed by a valve body. At this time, a substrate transferring port of the other chamber communicates with a gate valve unit in state of being open. Due to this, although first and second sealing members are heated due to heat from a hot wall chamber to thereby reduce a sealing function and allow air to penetrate, the air enters the interior of the gate valve unit from communicate holes and flows from the substrate transferring port to the other chamber so as to be exhausted by the other chamber. As a result, since the air, which enters the interior of the other chamber by passing through the outer second sealing member, can be prevented from entering the interior of the one chamber required to maintain the high vacuum degree, the pressure in the one chamber can be presented from increasing and the predetermined vacuum pressure can be maintained.

As described above, as a gap between the first sealing member and the second sealing member is vacuum-evacuated by the other chamber, the air can be effectively prevented from entering the interior of the one chamber required to maintain the high vacuum degree by passing through the first sealing member although the air passes through, for example, the outer second sealing member.

According to one embodiment of the present invention, although, for example, processing gas supplied for processing the substrate in the hot wall chamber enters the interior of the gate valve unit from the substrate transferring port of the chamber, the processing gas can be prevented from being adhered to the surface of a bellows. Thus, the generation of particles can be prevented.

Accordingly, since the communicate holes are not clogged by a valve body restriction member, the air can be effectively exhausted from the communicate holes towards the process chamber.

According to one embodiment of the present invention, when the transfer chamber required to maintain the high vacuum degree is depressurized, the substrate transferring port of the transfer chamber is closed by the valve body. At this time, the substrate transferring port of the hot wall chamber communicates with the gate valve unit in a state of being open. Due to this, although the first and second sealing members are heated due to the heat from the hot wall chamber to thereby reduce a sealing function and allow air to penetrate, the air enters the interior of the gate valve unit from communicate holes and flows from the substrate transferring port to the hot wall chamber so as to be exhausted by the hot wall chamber. As a result, since the air, which enters the interior of the hot wall chamber by passing through the outer second sealing member, can be prevented from entering the interior of the transfer chamber required to maintain the high vacuum degree, the pressure in the transfer chamber can be presented from increasing and the predetermined vacuum pressure can be maintained.

According to one embodiment of the present invention, with regard to the gate valve unit provided between the high vacuum hot wall chamber and the transfer chamber when the high vacuum hot wall chamber is connected to the transfer chamber, as the gate valve unit is configured as described above, when the chamber required to maintain the high vacuum degree is depressurized, the substrate transferring port of the chamber is closed by the valve body. At this time, the substrate transferring port of the other chamber communicates with the gate valve unit in a state of being open. Due to this, although the first and second sealing members are heated due to the heat from the hot wall chamber to thereby reduce a sealing function and allow air to penetrate, the air enters the interior of the gate valve unit from the communicate holes and flows from the substrate transferring port to the other chamber so as to be exhausted by the other chamber. As a result, since the air, which enters the interior of the other chamber by passing through the outer second sealing member, can be prevented from entering the interior of the chamber required to maintain the high vacuum degree, the pressure in the chamber can be presented from increasing and the predetermined vacuum pressure can be maintained.

DETAILED DESCRIPTION OF THE EMBODIMENTS

Figure 1:
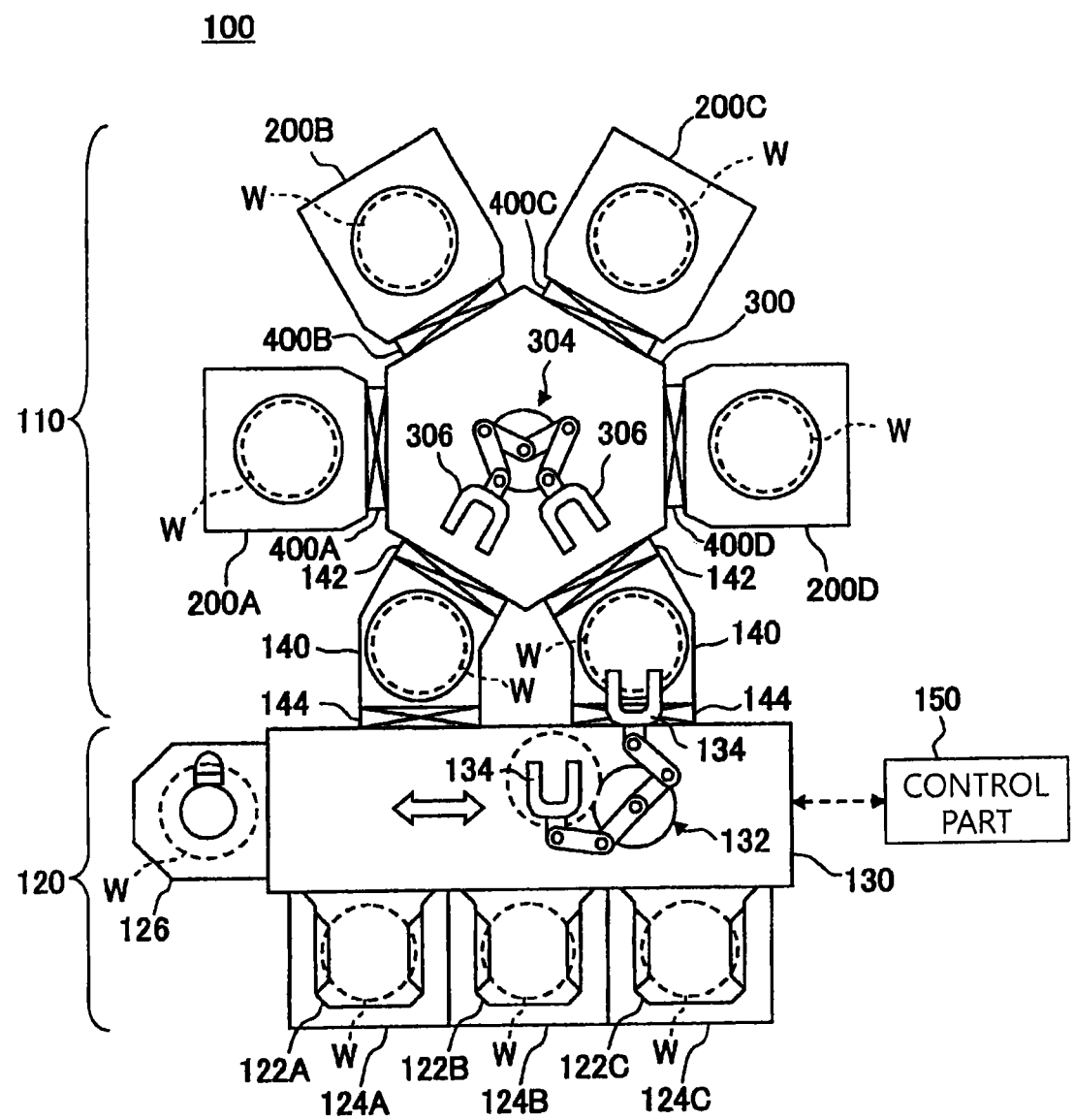
FIG. 1 is a view illustrating a schematic configuration of a substrate processing device according to an embodiment of the present invention to which a gate valve unit can be applied.

Hereinafter, preferred embodiments of the present invention will now be described in detail with reference to the accompanying drawings. Throughout the specification and the drawings, the elements having substantially the same functions and configurations are denoted by the same reference numerals, and thus explanation of which is not repeated. Also, 1 Torr in the specification refers to 101325/760 Pa.

(A Configuration Example of a Substrate Processing Device)

First, a configuration example of a substrate processing device according to an embodiment of the present invention to which a gate valve unit can be applied will be described with reference to the drawings. FIG. 1 is a cross-sectional view showing a schematic configuration of the substrate processing device according to the embodiment. The substrate processing device 100 shown in FIG. 1 includes: a process module 110 (a vacuum processing unit) in which a plurality of process chambers 200A to 200D (for example, four process chambers) configured to perform a processing process (for example, film formation processing, annealing or the like) is connected to a transfer chamber 300 (a common transfer chamber) via gate valves 400A to 400D; and a loader module (a transfer unit) 120 configured to load or unload wafers W for the process module 110. Also, the number of the process chambers is not limited to that of the case shown in FIG. 1.

Each of the process chambers 200A to 200D and the transfer chamber 300 are configured so that their interiors can be depressurized to a predetermined vacuum pressure, and the loader module 120 includes a loader chamber 130 of an atmospheric pressure atmosphere.

The gate valves 400A to 400D are respectively configured to open and close between substrate transferring ports (not shown in FIG. 1) formed in sidewalls of the transfer chamber 300 and substrate transferring ports (not shown in FIG. 1) formed in sidewalls of the process chambers 200A to 200D. The Gap between each gate valve 400A to 400D and each sidewall of the chambers 200A to 200D and 300 is hermetically sealed by a sealing member (not shown in FIG. 1) such as an O-ring or the like so that air cannot enter the chambers through each substrate transferring port when the chambers are depressurized. The substrate transferring ports and a sealing structure will be described later.

Two load lock chambers 140, which are configured to adjust pressure between the process module 110 of the vacuum atmosphere and the loader module 120 of the atmospheric pressure atmosphere, are connected to the transfer chamber 300 via respective gate valves 142. Each load lock chamber 140 is connected to the loader chamber 130 via each gate valve 144.

A transfer arm mechanism 304 configured to transfer the wafers W is arranged in the transfer chamber 300. The transfer arm mechanism 304 has two rotatable and stretchable transfer arms 306 and is able to transfer processed wafers W and unprocessed wafers W so as to be replaced with each other. The wafers W are transferred between the load lock chambers 140 and the process chambers 200A to 200D by the transfer arm mechanism 304.

At the loader chamber 130, a plurality of cassette seats 124A to 124C on which cassette containers 122A to 122C accommodating a plurality of wafers W (for example, 25 wafers) are set; and an orientor 126 (pre-alignment stage) as a pointing device for the wafers W are arranged.

In the loader chamber 130, a loader arm mechanism 132 configured to load or unload the wafers W is provided. The loader arm mechanism 132 has two rotatable and stretchable loader arms 134 and is able to load and unload the processed wafers W and the unprocessed wafers W so as to be replaced with each other. Also, the load arm mechanism 132 is configured so as to be movable horizontally in the loader chamber 130. The loader arm mechanism 132 transfers the wafers W between each of the cassette container 122A to 122C, the orientor 126 and each load lock chamber 140.

A control part (entire control unit) 150 is connected to the substrate processing device 100 so that process chambers 200A to 200D, the transfer chamber 300, the load lock chambers 140, the loader chamber 130, the gate valves 400A to 400D, 142 and 144 and the like can be controlled by the control part 150.

Also, a storage part (not shown), in which a program for realizing various processing processes (a processing process such as film formation processing for the wafers W, transfer control of the wafers W or the like) performed in the substrate processing device 100 using control of the control part 150, processing conditions (recipe) necessary for executing the program and the like are stored, is connected to the control part 150.

The program and the processing conditions may be stored in a hard disk or a semiconductor memory and may be also set up in a predetermined position by the storage unit while being housed in a storage medium which is readable by a computer with transferability such as a CD-ROM, a DVD, or the like. The control part 150 controls each part by reading the desired program and processing conditions from the storage part so that a desired processing process is performed in the substrate processing apparatus 100.

In the substrate processing device 100, when processing the wafers W, the wafer W is transferred from one of the cassette containers 122A to 122C by the loader arm mechanism 132 to the orientor 126. Then, the wafer W positioned in the orientor 126 is transferred from the orientor 126 into one of the load lock chambers 140. At this time, if a processed wafer W, which has been subjected to all required processes, exists in the corresponding load lock chamber 140, an unprocessed wafer W is loaded in the corresponding load lock chamber 140 after the processed wafer W is unloaded therefrom.

The unprocessed wafer W loaded in the load lock chamber 140 is transferred from the load lock chamber 140 by the transfer arm mechanism 304 into one of the processing chambers 200A to 200D for processing the unprocessed wafer W and a processing process is performed on the unprocessed wafer W. The corresponding wafer W which has been subjected to the processing process in the corresponding process chamber is unloaded by the transfer arm mechanism 304. At this time, if the corresponding wafer W is needed to be consecutively processed in another process chamber, the wafer W is loaded into the process chamber for performing a next process so that the next processing process can be performed on the corresponding wafer W.

Then, the processed wafer W which has been subjected to all required processing processes is returned to the other one of the load rock chambers 140. The processed wafer W returned to the load lock chamber 140 is returned to the original one of the cassette containers 122A to 122C by the loader arm mechanism 132.

In the substrate processing device 100, the gate valves 400A to 400D are closed. When loading and unloading of the wafer W is performed between one of the process chambers 200A to 200D and the transfer chamber 300, only the gate valve of the corresponding process chamber is opened.

When one of the gate valves 400A to 400D is opened, it is required to prevent a large difference in pressure from occurring between the corresponding one of the process chambers 200A to 200D and the transfer chamber 300 for the purpose of preventing particle generation or the like. To that end, before opening the gate valves 400A to 400D, vacuum pressure inside the transfer chamber 300 is adjusted to be almost equal to that in the corresponding process chamber. For example, in the case where the process chamber 200A is a high vacuum chamber for performing the processing of the wafer W at a high vacuum degree, the transfer chamber 300 is also required to be maintained at the high vacuum degree when the wafer W is transferred between the transfer chamber 300 and the process chamber 200A.

However, in case where at least one of the process chambers 200B to 200D is a hot wall chamber, a temperature of the sidewall of which becomes higher than room temperature (approximately 25° C.), the heat is transmitted to the gate valves 400B to 400D and the sealing members sealing the substrate transferring ports are heated. Since the sealing members are made of the O-ring such as the fluorine-based rubber or the like, a sealing effect thereof is deteriorated, to which results in such a problem that the air may penetrate therethrough.

At this time, depending on a sealing structure or a configuration of the gate valve, the air passing through the sealing members enters the chambers through the substrate transferring ports, and the vacuum pressure in the transfer chamber 300 or the vacuum pressure in the process chambers 200A to 200D increases, thereby causing such a problem that the predetermined vacuum pressure may not be maintained.

(A Configuration Example of Chambers Including the Hot Wall Chamber)

With regard to the aforesaid problems generated when at least one of the process chambers 200B to 200D is the hot wall chamber, it will be more specifically described with detailed configuration example of the chamber structure. The following description will be given to the configuration example of the chamber structure showing a case where the hot wall chamber, the temperature of the sidewall of which may become higher than a room temperature (appropriately 25° C.), and a cold wall chamber, a temperature of the sidewall of which may become the room temperature or less, are used together as the process chambers of the substrate processing device 100 shown in FIG. 1.

Figure 2:
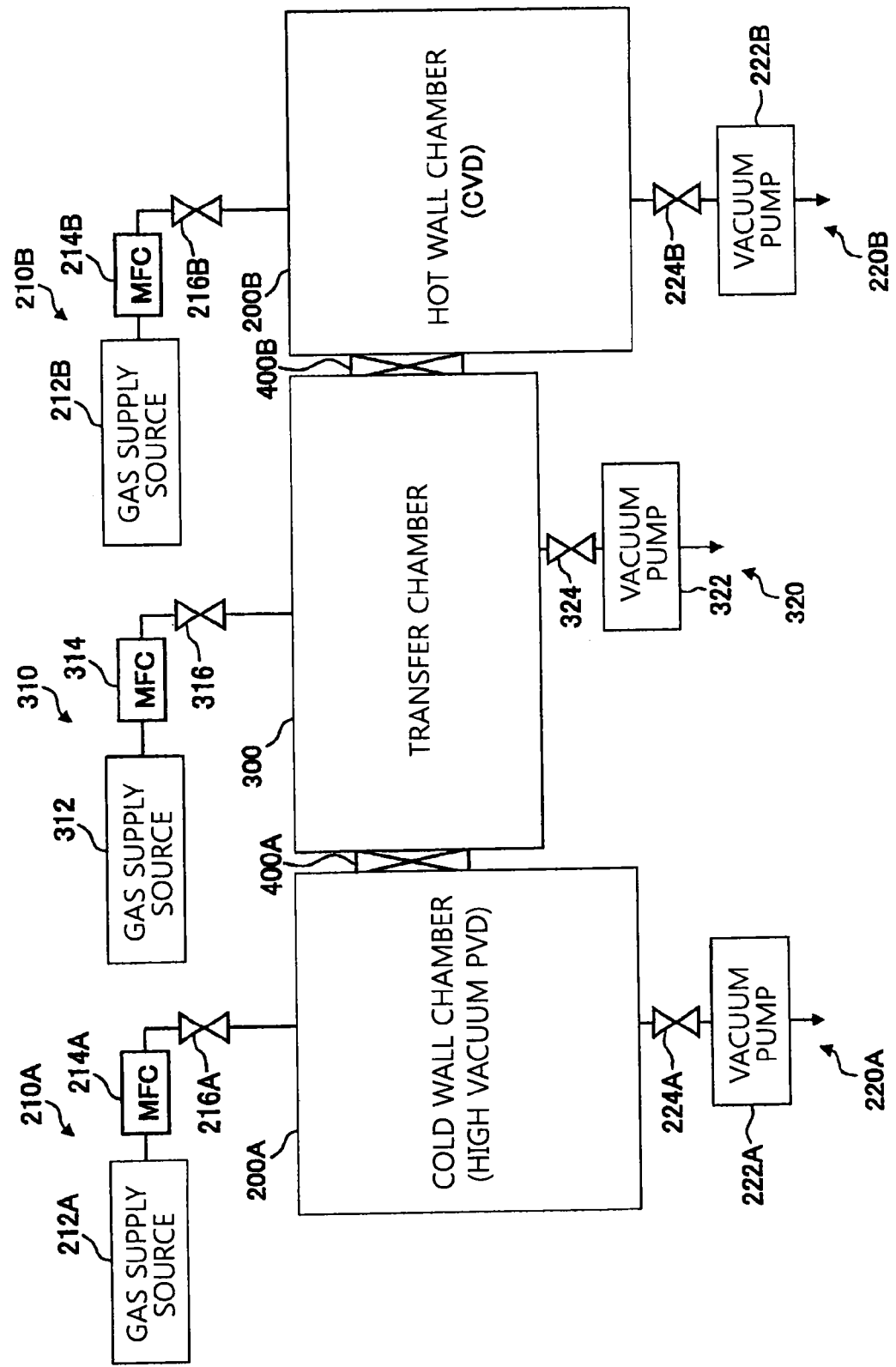
FIG. 2 is a cross-sectional view for explaining a configuration example of a chamber including a hot wall chamber in the substrate processing device shown in FIG. 1.

FIG. 2 is a view for explaining the configuration example of the chamber structure including the hot wall chamber and shows a case where the process chamber 200A shown in FIG. 1 serves as the cold wall chamber for performing processing of the wafer W in a pressure atmosphere of a high vacuum degree, and the process chamber 200B serves as the hot wall chamber for performing the processing of the wafer W in a pressure atmosphere of a lower vacuum degree than that of the process chamber 200A.

The process chamber 200A shown in FIG. 2 serves as a high vacuum PVD chamber for performing a PVD (Physical Vapor Deposition) process for which a high vacuum degree, e.g., a pressure of about $1 \times 10^{-9}$ to $1 \times 10^{-7}$ Torr, is required. One example of the PVD process is a film forming process for forming a film such as a Ti film, a Cu film or the like on the wafer W.

The process chamber 200B shown in FIG. 2 serves as a CVD chamber for performing a CVD (Chemical Vapor Deposition) process for which a lower vacuum degree than that of the PVD chamber, e.g., a pressure of about $1 \times 10^{-6}$ to $1 \times 10^{-3}$ Torr, is required. One example of the CVD process is a film forming process for forming a Ru film, a Hf film or the like on the wafer W.

The configuration of a pipe for a gas introduction system and an exhaust system will be described with reference to FIG. 2. As illustrated in FIG. 2, the process chambers 200A and 200B are respectively provided with gas introduction systems 210A and 210B capable of introducing necessary gas depending on the type of process for the wafer W such as Ar gas, Ne gas, He gas, $N_2$ gas, $H_2$ gas, CO gas or the like in addition to a processing gas such as film-forming gas or the like into the process chambers 200A and 200B, and exhaust systems 220A and 220B for exhausting the interior of the chambers 200A and 200B.

The gas introduction systems 201A and 210B are configured such that gas supply sources 212A and 212B are connected to the process chambers 200A and 200B via mass flow controllers 214A and 214B, and gas introduction valves 216A and 216B, respectively. The examples of gas introduced from the gas supply source 212A into the process chambers 200A are $TiCl_4$ gas, Ar gas and the like in the case of Ti film formation.

The examples of gas introduced from the gas supply source 212B into the process chamber 200B are a gas generated by heating and vaporizing a solid Ru complex (for example, $Ru_3(CO)_{12}$: Ruthenium carbonium) at room temperature, a carrier gas (e.g., CO gas) used in the vaporizing, a dilution gas (e.g., Ar gas or $N_2$ gas), and the like. Also, the gas introduction systems 210A and 210B are not limited to the configuration shown in FIG. 2.

For example, the exhaust systems 220A and 220B are configured such that vacuum pumps 222A and 222B are connected to the process chambers 200A and 200B via pressure regulating valves 224A and 224B, respectively. The vacuum pumps 222A and 222B include, e.g., a main pump such as a turbo molecular pump or the like and an auxiliary pump such as a dry pump or the like connected to an exhaust side of the main pump. For example, the auxiliary pump performs a rough pumping exhaust process for exhausting the interiors of the chambers 200A and 200B to a regular vacuum degree, and the main pump performs a fine pumping exhaust process for exhausting the interiors of the chambers 200A and 200B to a higher vacuum degree.

Also, the pressure regulating valves 224A and 224B may be composed of an APC (Auto Pressure Controller) valve, thereby regulating an exhaust conductance by automatically changing an opening level of the valves so that pressure in the interiors of the process chambers can be maintained to a target level when a predetermined gas is introduced from the gas introduction systems 210A and 210B into the interiors of the process chambers 200A and 200B.

Also, a cryo pump may be equipped in the vacuum pump 222A of the process chamber 200A for which the pressure of a high vacuum degree is required. The interior of the chamber 200A may be adjusted to a more high vacuum degree by operating the cryo pump as well as the main pump and the auxiliary pump.

Since the transfer chamber 300 shown in FIG. 2 is connected to the process chamber 200A which is the PVD chamber for which the high vacuum degree is required, when the wafer W is transferred therebetween, the transfer chamber 300 is required to maintain the pressure of a high vacuum degree corresponding to the pressure of the process chamber 200A.

The configuration of a pipe for a gas introduction system and an exhaust system of the transfer chamber 300 will be hereinafter described. The transfer chamber 300 is provided with a gas introduction system 310 allowing a predetermined gas such as purge gas to be introduced into the transfer chamber 300, and an exhaust system 320 for exhausting the interior of the transfer chamber 300.

For example, the gas introduction system 310 is configured such that a gas supply source 312 is connected to the transfer chamber 300 via a mass flow controller 314 and a gas inlet valve 316. The example of gas introduced from the gas supply source 312 into the transfer chamber 300 is inert gas such as Ar gas, Ne gas, He gas, $N_2$ gas or the like. Also, the gas introduction system 310 is not limited to the configuration shown in FIG. 2.

For example, the exhaust system 320 is configured such that a vacuum pump 322 is connected to the transfer chamber 300 via a pressure regulating valve 324. The vacuum pump 322 is composed of, for example, a main pump such as a turbo molecular pump or the like, and an auxiliary pump such as a dry pump or the like connected to an exhaust side of the main pump. For example, the auxiliary pump performs a rough pumping exhaust process for exhausting the interior of the transfer chamber 300 to a regular degree of vacuum, and the main pump performs a fine pumping exhaust process for exhausting the interior of the transfer chamber 300 to a high vacuum degree. As a result, the pressure within the transfer chamber 300 may be depressurized even under the condition of a high vacuum pressure of about $1\times10^{-9}$ to $1\times10^{-6}$ Torr.

Also, as the case of the process chamber 200A, the cryo pump may be also equipped in the vacuum pump 222A of the transfer chamber 300 for which the pressure of a high vacuum degree is required. The interior of the process chamber 200A may be adjusted to a more high vacuum degree by operating the cryo pump as well as the main pump and the auxiliary pump.

When, for example, a Ti film formation process or a Cu film formation process using the PVD process is performed in the process chamber 200A, a PVD-Ti film or a PVD-Cu film is formed by supplying film forming gas to the interior of the chamber in a high vacuum atmosphere of, e.g., $1\times10^{-8}$ Torr while heating the wafer W. Also, when, for example, an Ru film formation process using the CVD process is performed in the process chamber 200B, a CVD-Ru film is formed by supplying the film forming gas to the interior of the chamber in a high vacuum atmosphere of, e.g., $1\times10^{-6}$ Torr while heating the wafer W.

Like this, since the process chambers 200A and 200B perform the process by heating the wafer W, all sidewalls of the chambers are heated. However, in the process chamber 200A, since a film forming material other than a solid is used at room temperature, the process chamber 200A may serve as a cold wall chamber by cooling the temperature of the sidewall thereof to about 20° C.

In contrast, in the process chamber 200B, since a solid film forming material ($Ru_3(CO)_{12}$) is used in a state of being vaporized at room temperature, the sidewall of the chamber may be not cooled. This is because the film forming material may be solidified on and adhered to an inner side of the chamber when the sidewall of the chamber is cooled. Due to this, since the sidewall of the chamber is heated at a temperature of, e.g., 80° C. or higher, the process chamber 200B becomes a hot wall chamber.

Figure 3:
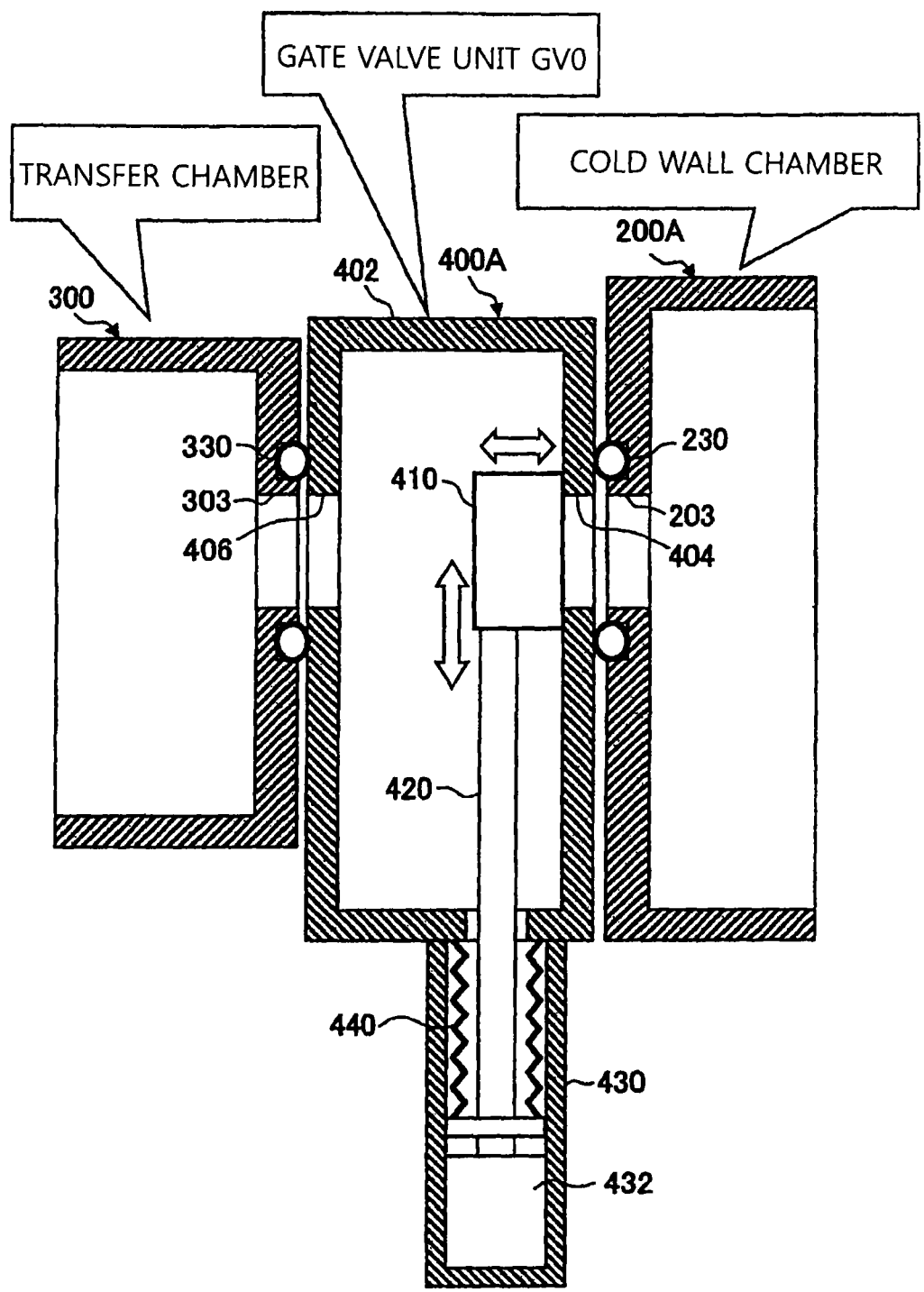
FIG. 3 is a cross-sectional view showing a schematic configuration of a gate valve unit GV0 according to a comparative example that is applied to a gate valve connected to a cold wall chamber.
Figure 4:
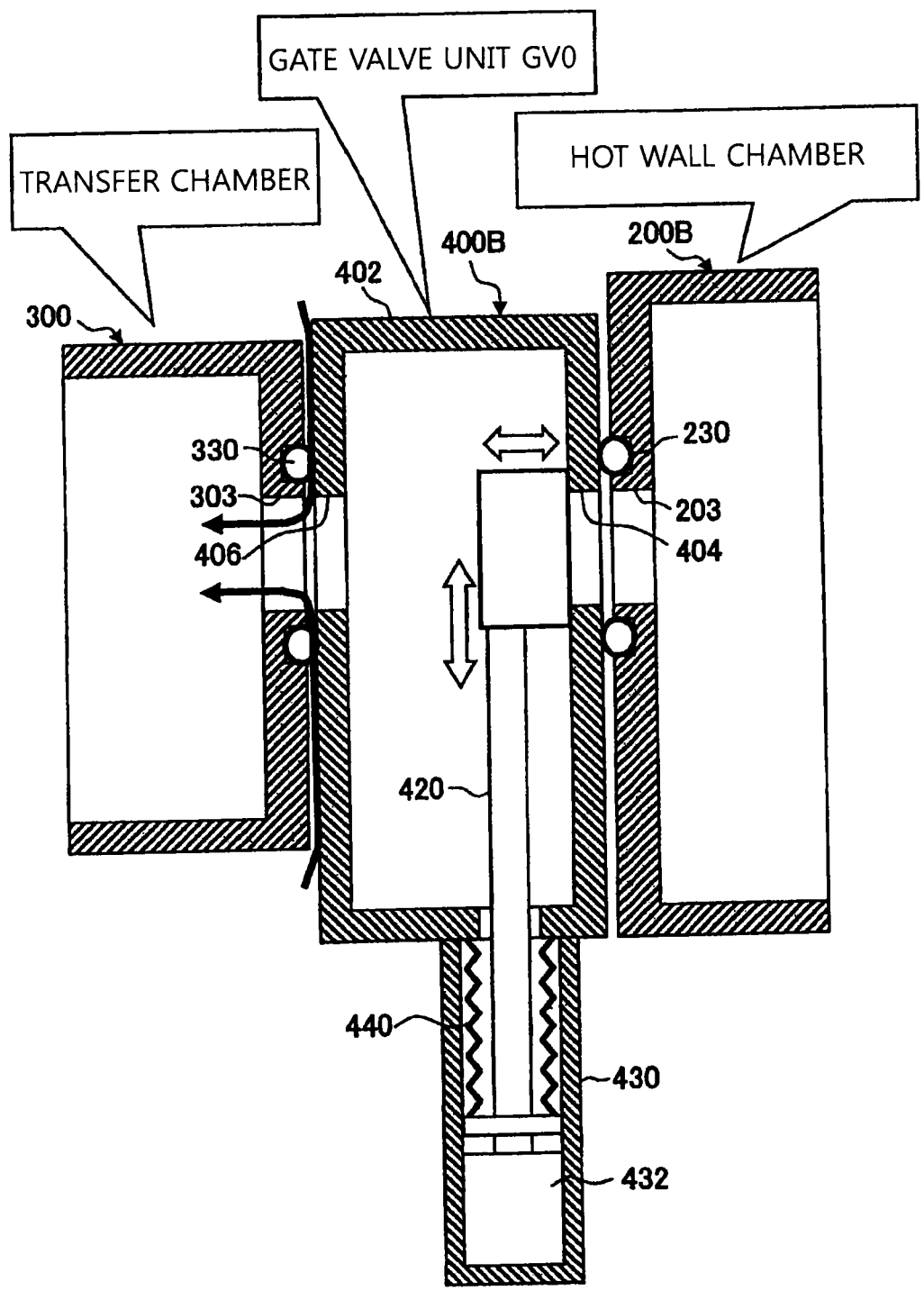
FIG. 4 is a cross-sectional view for explaining a configuration and an operation of a case where the gate valve unit GV0 according to the comparative example is applied to the gate valve connected to the hot wall chamber.

Hereinafter, the gate valves 400A and 400B connected to the process chambers 200A and 200B, and a sealing structure thereof will be described with comparative examples. FIGS. 3 and 4 are cross-sectional views showing a schematic configuration of a gate valve unit (GV0) according to a comparative example. FIG. 3 shows a case where the gate valve unit (GV0) according to the comparative example is applied to the gate valve 400A of the cold wall chamber, and FIG. 4 shows a case where the gate valve unit (Gv0) according to the comparative example is applied to the gate valve 400B of the hot wall chamber.

For example, the gate valve unit GV0 according to the comparative example is configured as illustrated in FIG. 3. That is, the gate valve unit GV0 shown in FIG. 3 has a box-shaped housing 402 made of metal such as aluminum or the like, one sidewall of which is connected to the sidewall of the process chamber 200A, and another sidewall of which is connected to the sidewall of the transfer chamber 300. Substrate transferring ports 404 and 406 having an almost same shape as that of substrate transferring ports 203 and 303 respectively formed in the sidewall of the process chamber 200A and the sidewall of the transfer chamber 300 are formed in the sidewalls of the housing 402.

In the gate valve unit GV0, a sealing member 330 such as an O-ring or the like is provided between the transfer chamber 300 and the housing 402 to surround the substrate transferring ports 303 and 406, and the substrate transferring ports 203 and 404 for the process chamber 200A are formed to be opened and closed by a valve body 410. Also, a sealing member 230 such as an O-ring or the like is also provided between the process chamber 200A and the housing 402 to surround the substrate transferring ports 203 and 404.

As a peripheral side surface of the substrate transferring port 404 serves as a valve seat, the valve body 410 is configured to be detachably connected to the valve seat (to open and close the substrate transferring port 404) and to be elevatable. Thus, when the substrate transferring port 404 is closed, the valve body 410 can close and seal the substrate transferring port 404 by coming into contact with the peripheral side surface of the substrate transferring port 404. Also, the sealing member such as the O-ring or the like may be interposed between the peripheral side surface of the substrate transferring port 404 and the valve body 410.

The valve body 410 is mounted to the tip of an elevatable elevating shaft 420, and a base end of the elevating shaft 420 is connected to a lower valve body driving part 432 through an elevation guide frame 430 provided to protrude at a lower portion of the housing 402.

The valve body driving part 432 is configured to drive the valve body 410 to elevate and to open and close the substrate transferring port 404 (to be contacted with and separated from to the substrate transferring port 404). For example, in the case of closing the substrate transferring port 404, the valve body driving part 432 allows the valve body 410 to be driven so as to move in a direction in which the substrate transferring port 404 is closed after elevating the valve body 410 up to a position opposite to the substrate transferring port 404 with putting a gap to such an extent that the valve body 410 is not in contact with an inner side of the sidewall of the housing 402. On the contrary, in the case of opening the substrate transferring port 404, after the valve body 410 is displaced in a direction away from the substrate transferring port 404 until a gap is generated to such an extent that the valve body 410 is not in contact with the inner surface of the sidewall of the housing 402, the valve body 410 is moved down to the standby position of a lower portion so as not to interrupt loading and unloading operations of the wafer W performed through the substrate transferring port 404.

Here, the valve body driving part 432 may be composed of, for example, an air cylinder for elevatably driving the elevating shaft 420, and a cam mechanism for guiding the elevating shaft 420 so as to enable the valve body 410 to perform the elevating operation, and the opening and closing operation. In this case, for example, a projection is provide on the elevating shaft 420 and a cam hole for guiding the projection has a shape which is formed so that the valve body 410 can be driven to elevate and to open and close the substrate transferring port 404. Also, the configuration of the valve body driving part 432 is not limited to thereto.

Since the valve body driving part 432 becomes a pollution source of particle generation, the valve body driving part 432 is required to be isolated from an internal space of the housing 402 for which cleanliness is required. Due to this, a bellows 440 is disposed in the elevation guide frame 430 to cover the elevating shaft 420. The bellows 440 is composed of, for example, an airtight bellows-like member having corrosion resistance such as stainless or the like.

The bellows 440 is configured to be freely stretchable depending on an elevating operation. Here, an upper end of the bellows 440 is mounted to a hole edge formed in a bottom portion of the housing 402, and a lower end thereof is mounted to a lower portion of the elevating shaft 420. Thus, an internal space of the bellows 440 communicates with an internal space of the housing 402 and is isolated from an outer space of the bellows 440.

According to the gate valve unit GV0, as illustrated in FIG. 3, under a state where the substrate transferring port 404 for the process chamber 200A is closed by the valve body 410, and the substrate transferring port 406 for the transfer chamber 300 is open, the transfer chamber 300 is maintained in a state of being depressurized up to a high vacuum pressure (for example, $1 \times 10^{-8}$ Torr). In the state, the substrate transferring port 404 is opened by separating the valve body 410 from the substrate transferring port 404 moving the valve body 410 down to a retracted position, thereby allowing loading and unloading of the wafer W between the transfer chamber 300 and the process chamber 200A.

In the gate valve 400A connected to the cold wall chamber such as the process chamber 200A, since a sealing effect of the O-ring is not reduced by the heat transferred from the process chamber 200A, under application of the gate valve unit GV0 shown in FIG. 3, although the transfer chamber 300 is depressurized in a state that the substrate transferring port 406 is opened, the pressure in the transfer chamber 300 is not changed so that the high vacuum degree can be maintained.

In contrast, as illustrated in FIG. 4, in the gate valve 400B connected to the hot wall chamber such as the process chamber 200B, under application of the gate valve unit GV0 shown in FIG. 3, if the transfer chamber 300 is depressurized in a state that the substrate transferring port 406 is opened, the vacuum pressure of the transfer chamber 300 may not be maintained.

That is, in the hot wall chamber such as the process chamber 200B, since the sidewall thereof has a temperature (for example, 80° C. or more) higher than room temperature, the heat is transferred to the gate valve 400B and the sealing member 330 of the transfer chamber 300 as well as the sealing member 230 of the process chamber 200B is heated.

Since the sealing members 230 and 330 are made of fluorine-based rubber (FKM, FPM, FFKM, FEPM or the like) or fluorine-based resin (FEP, PFA or the like), a sealing effect thereof is reduced depending on a temperature of the heated sealing members 230 and 330, thereby enabling the air to penetrate.

For example, when the sealing member 330 is heated so that air can pass through, as illustrated in FIG. 4, the air passing through the sealing member 300 penetrates the substrate transferring ports 406 and 303 and enters the interior of the transfer chamber 300, and thus the pressure in the transfer chamber 300 increases, thereby causing such a problem that the high vacuum degree in the transfer chamber 300 may not be maintained.

Thus, the gate valve 400B connected to the hot wall chamber may completely prevent the air from entering the transfer chamber 300 with only one sealing member 330 as the sealing structure for the transfer chamber 300. Furthermore, although another same sealing member to surround an outer side of the sealing member 330 is further provided so as to form a double sealing structure, since the sealing members are all heated, sealing functions of both sealing members are reduced. Accordingly, based on only the double sealing structure, the air may not completely be prevented from passing through the transfer chamber 300 and an increase in pressure may not be prevented.

In this case, under a state in which the vacuum degree of target pressure required for the transfer chamber 300 is high, if the sealing member is heated at a temperature higher than room temperature although the heated sealing member has a relative low temperature equal to or less than 100° C., as the vacuum degree of the target pressure gradually increases (the pressure gradually reduces), an amount of the air passing through the sealing member also increases so that the pressure in the transfer chamber 300 cannot be maintained.

Figure 5:
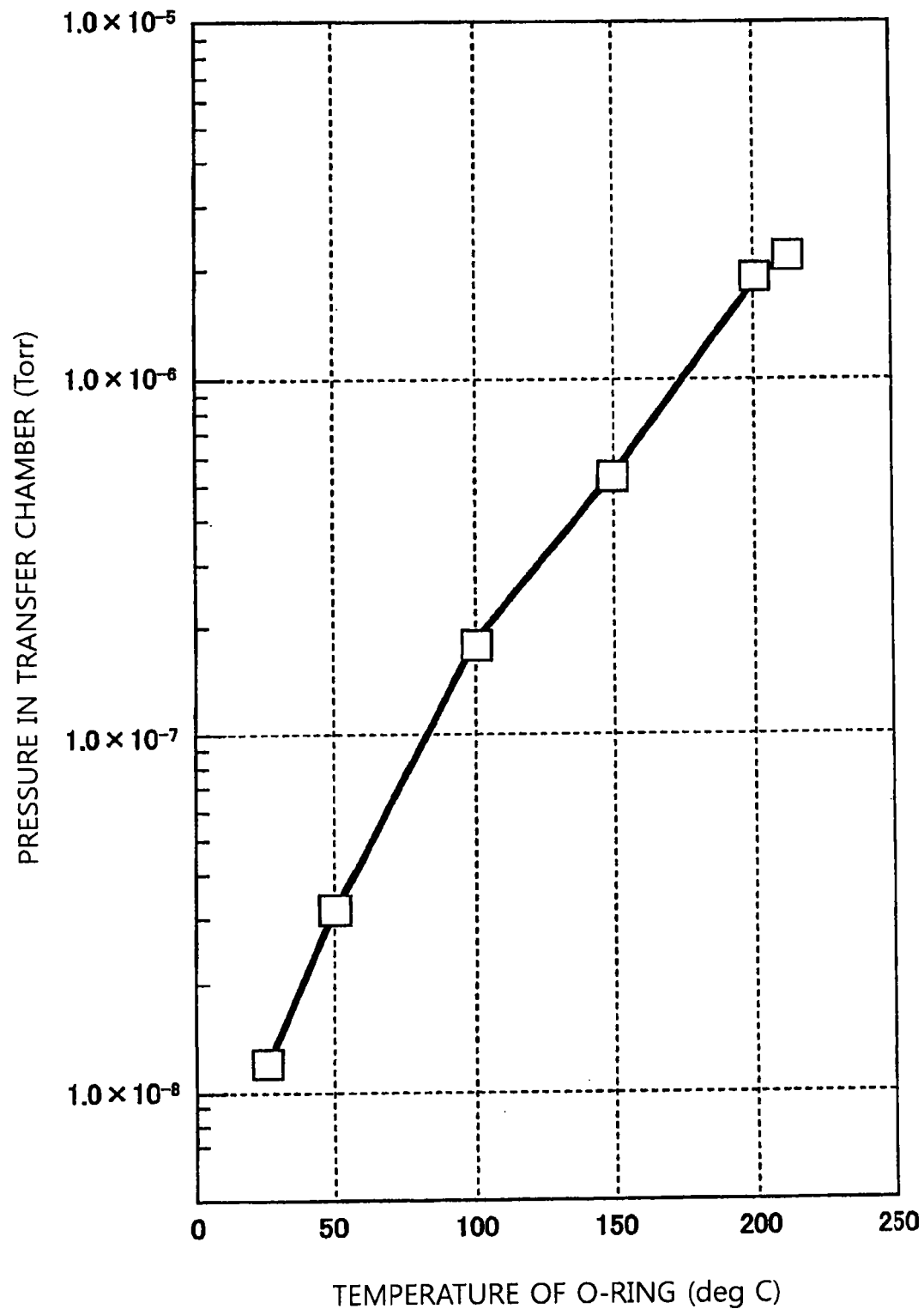
FIG. 5 is a graph showing each temperature of an O-ring made of fluorine-based rubber (FKM) and each pressure in the chamber which can be maintained at the temperatures.

Hereinafter, a relation between a temperature of the O-ring as the sealing member and pressure in the chamber sealed by the O-ring will be described with reference to the drawings. FIG. 5 is a graph showing temperatures of the O-ring made of fluorine-based rubber (FKM) and pressures in the chamber which can be maintained at the temperatures. This shows that when the O-ring has the same temperature, higher pressure than the pressures shown in the graph can be maintained, but lower pressure than the pressures shown in the graph cannot be maintained.

For example, when the temperature of the O-ring is about 80° C., the pressure in the chamber which can be maintained at that time is approximately $1 \times 10^{-7}$ Torr. Accordingly, in this case, approximately $1 \times 10^{-7}$ Torr or more pressure in the chamber can be maintained, but a lower pressure than $1 \times 10^{-7}$ Torr cannot be maintained.

From the graph shown in FIG. 5 in which the pressure in the transfer chamber 300 is increased as the temperature of the O-ring is increased, it could be confirmed that as the temperature of the O-ring increases, the amount of the air entering the transfer chamber 300 increases, and thus the pressure in the chamber, which can be maintained at that time, also increases. Also, reviewing FIG. 5 in terms of the pressure in the chamber, it could be confirmed that the pressure cannot be maintained even at a relatively low temperature equal to or less than 100° C. in a pressure range of a relatively high vacuum degree of $1 \times 10^{-8}$ to $1 \times 10^{-7}$ Torr. Also, since the graph shown in FIG. 5 is changed depending on a material of the O-ring, whether or not the pressure in the chamber can be maintained should be judged based on the material of the O-ring as well as the target pressure.

Reviewing the relation between the temperature and pressure on the basis of the graph shown in FIG. 5, if the temperature of the O-ring exceeds a room temperature (approximately 25° C.), although the temperature of the O-ring is a relatively low temperature equal to or less than 100° C., the pressure of the high vacuum degree of $1 \times 10^{-8}$ to $1 \times 10^{-7}$ Torr or below may not be maintained, but a lower vacuum degree than $1 \times 10^{-7}$ Torr, for example, the pressure of $1 \times 10^{-6}$ Torr or more, may be maintained.

When the temperature of the sidewall of the process chamber 200B (hot wall chamber) shown in FIG. 4 is about 80° C. and the pressure is $1 \times 10^{-6}$ Torr or more in a low vacuum degree, although the sealing member 230 is heated to enable the air to penetrate, the penetration amount of the air is small and the pressure in the process chamber 200B does not also increase so that the target vacuum pressure can be maintained.

In contrast, if the pressure of the transfer chamber 300 is $1\times10^{-7}$ Torr or below in a high vacuum degree and is required to be maintained, although the temperature of the sidewall of the process chamber 200B (the hot wall chamber) is about 80° C., when the sealing member 330 is heated to thereby enable the air to penetrate, the pressure of the transfer chamber 300 increases so that the target vacuum pressure cannot be maintained.

Also, since oxygen is included in the air, if the oxygen enters the interior of the transfer chamber 300, as the vacuum degree of the transfer chamber 300 increases, partial pressure of the oxygen also becomes higher. Due to this, if the wafer W before formation of a metal film such as Ru or the like exists in the transfer chamber 300, the base film is oxidized, and adhesion of the metal film may be also affected thereby. In contrast, if the vacuum degree of the process chamber 200B is low, although the air enters the interior of the process chamber 200B, since the amount of the air is small and the partial pressure of the oxygen is also low, no special problem occurs.

Therefore, in the present embodiment, for the gate valve unit connected between the transfer chamber and the hot wall chamber, the sealing structure for one of the chambers required to maintain higher vacuum pressure than the other chamber is configured such that the air does not enter the one chamber and the vacuum pressure of the one chamber could be maintained.

(Configuration Example of Gate Valve Unit)

Figure 6:
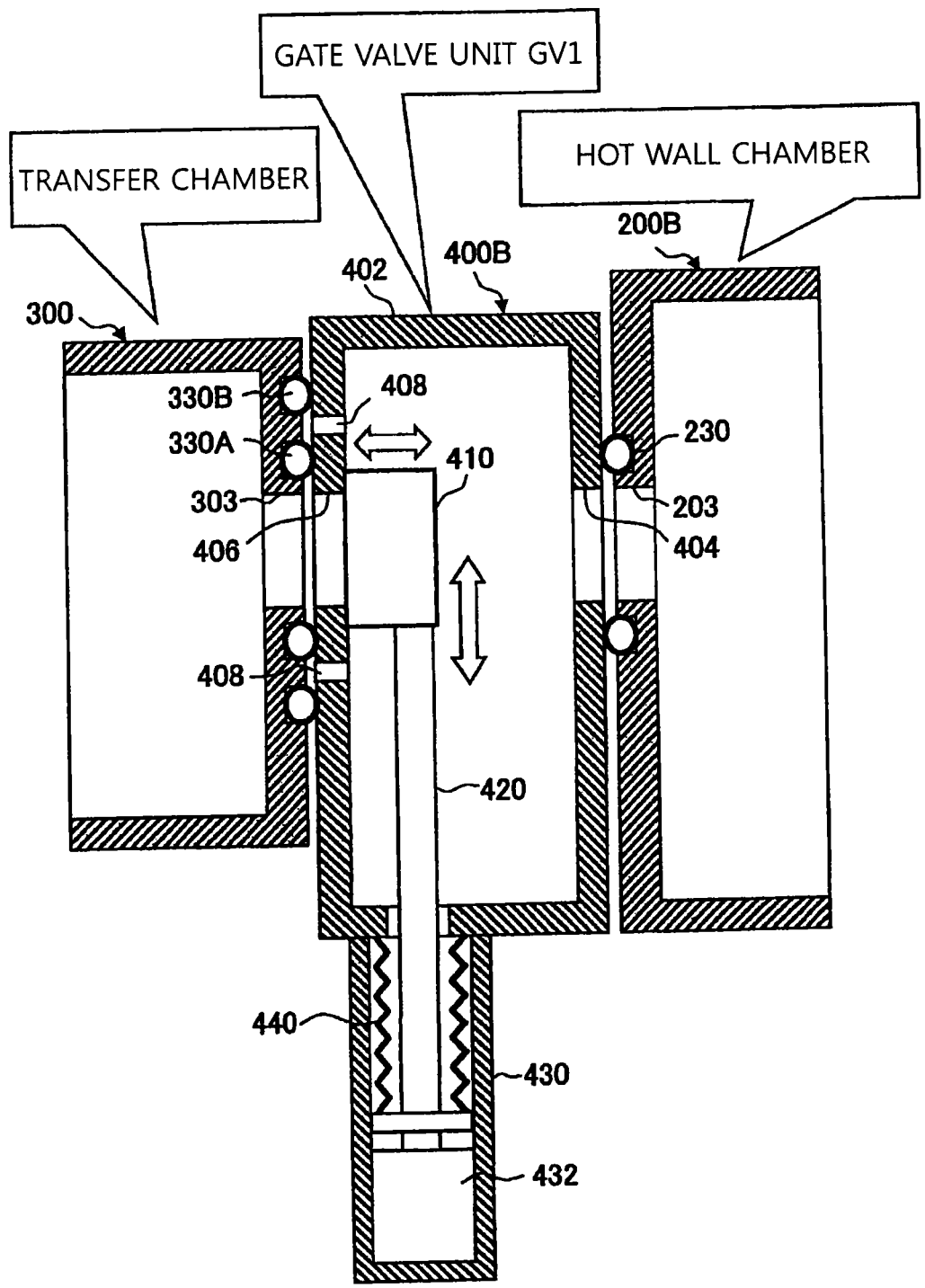
FIG. 6 is a cross-sectional view showing a schematic configuration of a gate valve unit GV1 according to the present embodiment that is applied to the gate valve connected to the hot wall chamber.
Figure 7:
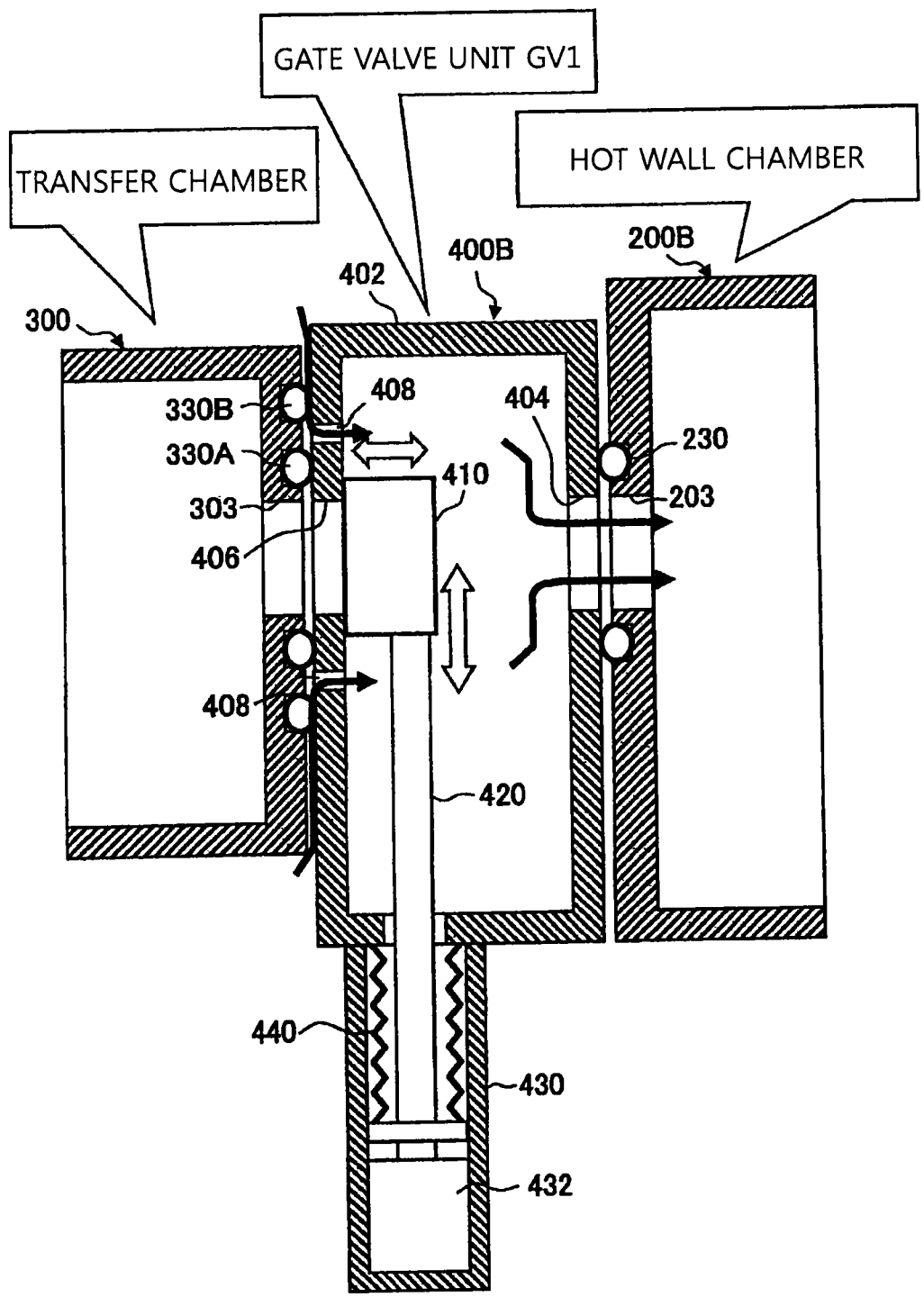
FIG. 7 is a view for explaining an operation of the gate valve device GV1 shown in FIG. 6.

Hereinafter, a configuration example of a gate valve unit GV1 according to the present embodiment will be more specifically described with reference to the drawings. FIG. 6 is a cross-sectional view showing a schematic configuration of the gate valve unit GV1 according to the present embodiment. The gate valve unit GV1 is applied to the gate valve 400B for the hot wall chamber shown in FIG. 2. FIG. 7 is a view for explaining an operation of the gate valve unit GV1.

As illustrated in FIG. 6, the gate valve unit GV1 has a double sealing structure including an inner first sealing member 330A surrounding the substrate transferring ports 303, 406 between the sidewall of the housing 402 of the gate valve unit GV1 and the sidewall of the transfer chamber 300, which is required to maintain the higher vacuum pressure (e.g., $10^{-8}$ Torr order) than the vacuum pressure (e.g., $10^{-6}$ Torr order) in the process chamber 200B (the hot wall chamber); and an outer second sealing member 330B surrounding the first sealing member 330A.

Also, communicating holes 408 for communicating a gap between the first sealing member 330A and the second sealing member 330B with an internal space of the gate valve unit GV1 are provided in the sidewall of the housing 402 of the gate valve unit GV1, the substrate transferring ports 303 and 406 for the transfer chamber 300 are configured to be opened and closed by the valve body 410, and the substrate transferring ports 203 and 404 for the process chamber 200B are open. The first sealing member 330A and the second sealing member 330B are composed of, e.g., the O-ring made of fluorine-based rubber (FKM, FPM, FFKM, FEPM or the like) or fluorine-based resin (FEP, PFA or the like).

Also, here, the process chamber 200B has the higher pressure than that of the transfer chamber 300, and for the sealing structure for the process chamber 200B in this case, although heated, the amount of the air passing through the sealing structure is not significantly great and the affect due to pressure increase or the like is small. Due to this, the sealing member for the process chamber 200B is sufficient as one sealing member 230 as illustrated in FIG. 6. However, the process chamber may also have the double sealing structure. The sealing member 230 is made of the same material as that of the first and second sealing members 330A and 330B.

In accordance with the gate valve unit GV1 according to the present embodiment, when the transfer chamber 300 is depressurized, the substrate transferring ports 303 and 406 at the transfer chamber 300 side are closed by the valve body 410. At this time, since the substrate transferring ports 203 and 404 at the process chamber 200B side are opened, the interior of the gate valve unit GV1 communicates with only the process chamber 200B via the substrate transferring ports 203 and 404.

Due to this, if the exhaust system 220B of the process chamber 200B is driven, even when the first and second sealing members 330A and 330B are heated and thus the sealing functions thereof are reduced and the air penetrates through the sealing member 330B, the air enters the gate valve unit GV1 through the communicating holes 408 and flows into the process chamber 200B through the substrate transferring ports 203 and 404 to be exhausted by the exhaust system 220B of the process chamber 200B as illustrated in FIG. 7.

Like this, as the gap between the inner first sealing member 330A and the outer second sealing member 330B is actively vacuum-evacuated by the exhaust system 220B of the process chamber 200B through the communicating holes 408, although, for example, the air passes through the outer second sealing member 330B, the air does not pass through the first sealing member 330A, so that the air is prevented from entering the interior of the transfer chamber 300 required to maintain the high vacuum degree.

Also, at this time, the pressure in the gate valve unit GV1 is equal to that in the process chamber 200B. That is, the pressure (for example, $10^{-6}$ Torr order) of the gate valve unit GV1 is higher than that of the transfer chamber 300 (for example, $10^{-8}$ Torr order). Due to this, although the air flows toward the process chamber 200B, the amount thereof is small and the process chamber 200B is slightly affected thereby.

Thus, according to the present embodiment, although the first and second sealing members 330A and 330B are heated by the heat transferred from the process chamber 200B (the hot wall chamber), the air, which passes through the outer second sealing member 330B, is prevented from entering the transfer chamber 300 so that the pressure in the transfer chamber 300 can be prevented from increasing and the pressure in the high vacuum degree can be maintained.

Here, an experiment for confirming the effect of a case (FIG. 6) where the gate valve unit GV1 according to the present embodiment is connected to the process chamber 200B (the hot wall chamber) was performed. A result thereof will be described by comparing the case with a case (FIG. 4) where the gate valve unit GV0 according to the comparative example is connected to the process chamber 200B.

Figure 8:
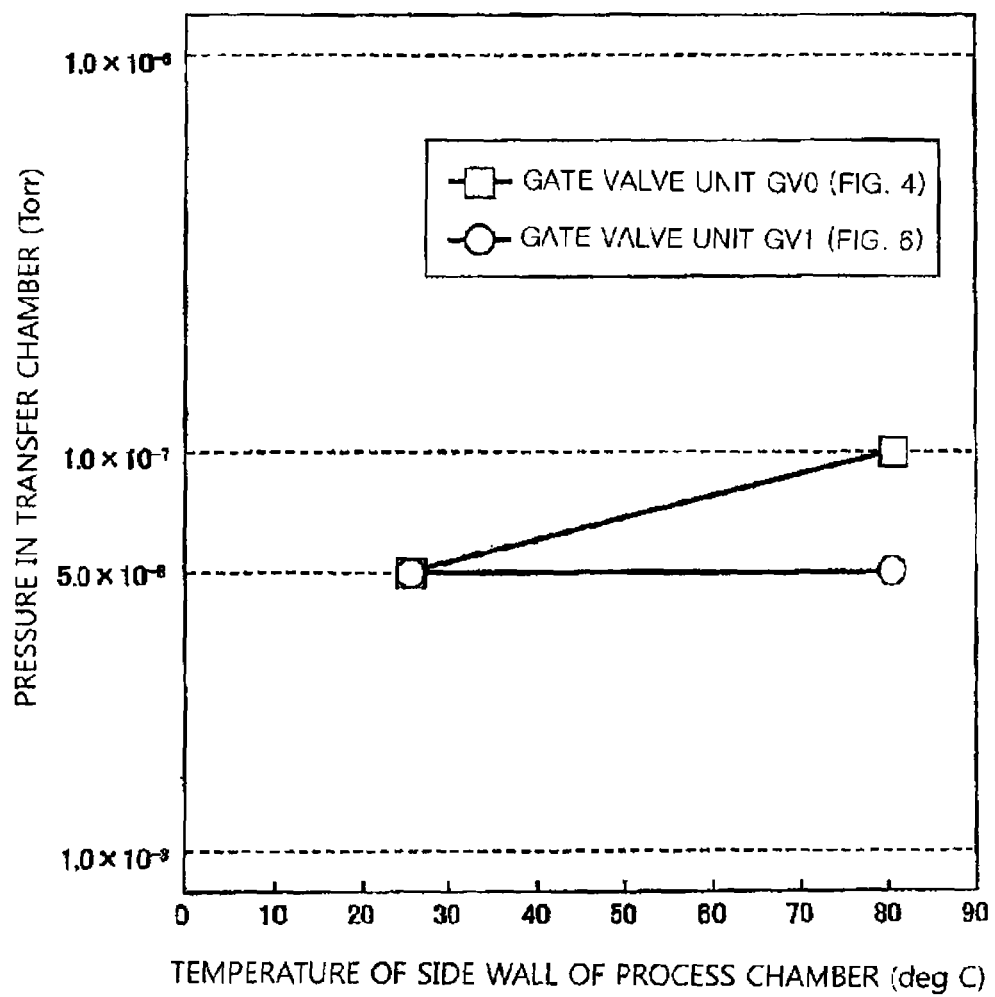
FIG. 8 is a graph showing results of an experiment to confirm effects of the gate valve unit GV1 according to the present embodiment and a relation between each temperature of a sidewall of a process chamber and each pressure in transfer chamber.

FIG. 8 is a view illustrating an experimental result and shows a relation between the temperature of the sidewall of the process chamber 200B and the pressure in the transfer chamber 300. In this experiment, the graph results from detecting an actual pressure in the transfer chamber 300 by changing the temperature of the sidewall of the process chamber 200B when the pressure in the transfer chamber 300 is depressurized to be maintained to a predetermined vacuum pressure ($5.0\times10^{-8}$ Torr) as target pressure.

In FIG. 8, a horizontal axis refers to the temperature of the sidewall of the process chamber 200B, and a vertical axis refers to the pressure in the transfer chamber 300. In FIG. 8, the graph of the white squares refers to the experimental result of a case where the gate valve unit GV0 (FIG. 4) according to the comparative example is used, and the graph of the white circles refers to the experimental result of a case where the gate valve unit GV1 (FIG. 6) according to the present embodiment is used.

In FIG. 8, through the graph of the white squares shown in the graph, it could be confirmed that, in the case (FIG. 4) of the comparative example, as the temperature of the sidewall of the process chamber 200B gradually increases, the actual pressure in the transfer chamber 300 increases so that the target pressure cannot be maintained.

In this regard, through the graph of the white circles shown in the graph, it could be confirmed that, in the case (FIG. 6) of the present embodiment, although the temperature of the sidewall of the process chamber 200B increases, the actual pressure in the transfer chamber 300 is not changed so that the target pressure can be maintained.

Like this, in the gate valve unit GV1 according to the present embodiment, through the experimental result, it could be confirmed that the pressure in the transfer chamber 300 can be prevented from increasing and can be maintained at a predetermined vacuum pressure.

Also, in the present embodiment, as the example of a case required to highly maintain the vacuum degree in the transfer chamber 300, a case where the hot wall chamber (process chamber 200B) and the chamber (process chamber 200A) for which a higher vacuum degree than the hot wall chamber is required are connected to the transfer chamber 300 is described as illustrated in FIG. 2, but the present invention is not limited thereto. The hot wall chamber itself may be the process chamber for which the high vacuum degree is required. In this case, if there is a need to highly maintain the vacuum degree in the transfer chamber 300, the gate valve unit GV1 shown in FIG. 6 may be also applied.

Also, when the vacuum degree of the hot wall chamber is required to be maintained higher than the vacuum degree of the transfer chamber 300 (or to maintain cleanliness of the hot wall chamber), the vacuum pressure in the hot wall chamber may be maintained by configuring the sealing structure for the hot wall chamber as illustrated in the example of a modification which will be described later such that no air enters the hot wall chamber.

(Modified Example of Gate Valve Unit)

Figure 9:
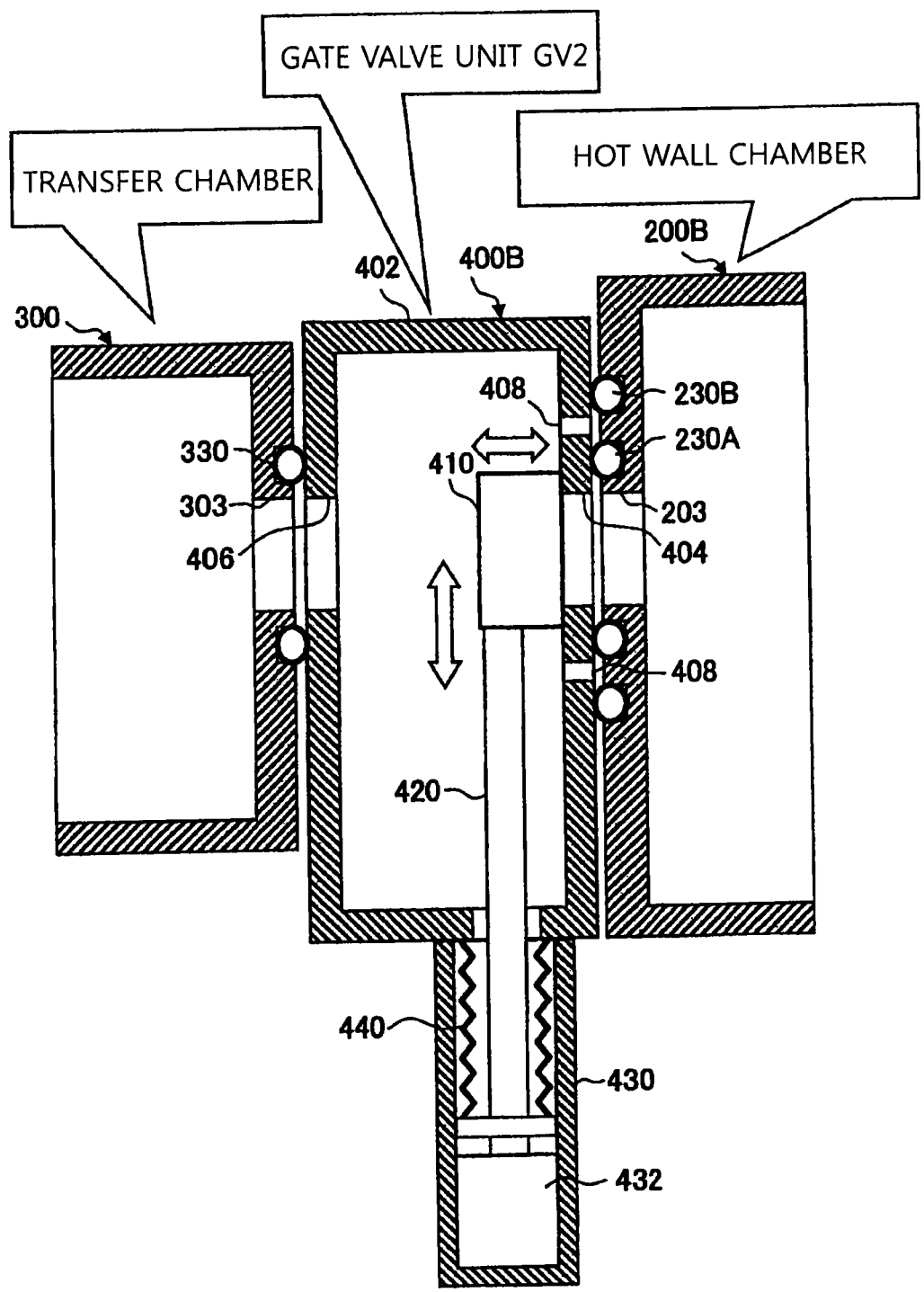
FIG. 9 is a cross-sectional view showing a schematic configuration of a gate valve unit GV2 according to a modification example of the present embodiment.
Figure 10:
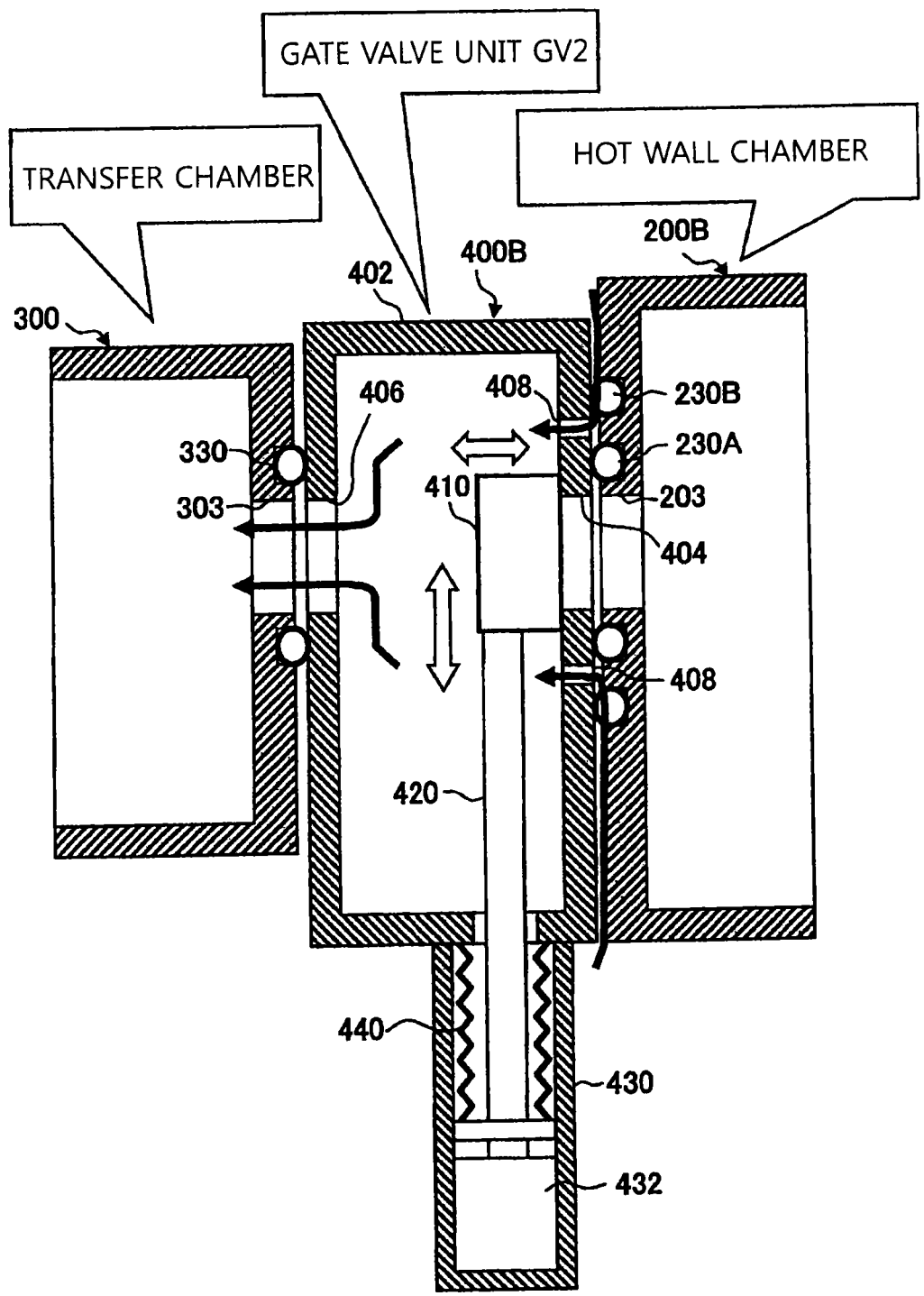
FIG. 10 is a view for explaining an operation of the gate valve unit GV2 shown in FIG. 9.

Hereinafter, a modified example of the gate valve unit according to the present embodiment will be described with reference to the drawings. FIG. 9 is a cross-sectional view for explaining a schematic configuration of a gate valve unit GV2 according to the modification example and FIG. 10 is a view for explaining an operation thereof. As the example, a case where the vacuum degree of the process chamber 200B (the hot wall chamber) is higher than that of the transfer chamber 300 and the pressure in the process chamber 200B is intended to be maintained is shown. Here, the process chamber 200B is composed of, e.g., a high vacuum CVD chamber for performing CVD processing at a high vacuum degree of, e.g., $10^{-7}$ Torr order or below.

As illustrated in FIG. 9, the gate valve unit GV2 is provided with the inner first sealing member 230A to surround the substrate transferring ports 203 and 404 between the sidewall of the process chamber 200B (the hot wall chamber) and the sidewall of the housing 402 of the gate valve unit GV2, which are placed at an opposite side to the case of FIG. 6, and the outer second sealing member 230B to surround the first sealing member 230A, thereby having a double sealing structure.

Also, in the sidewall of the housing 402 of the gate valve unit GV2, the communicating holes 408 for allowing the gap between the first sealing member 230A and the second sealing member 230B to communicate with an internal space of the gate valve unit GV2 are provided. The substrate transferring ports 203 and 404 at the process chamber 200B side, which are placed at an opposite side to the case of FIG. 6, are configures to be opened and closed by the valve body 410, and the substrate transferring ports 303 and 406 are open. The first and second sealing members 230A and 230B are composed of the same material as that of the first and second sealing members 330A and 330B shown in FIG. 6.

Also, the pressure in the transfer chamber 300 is higher than that in the process chamber 200B, and for the sealing structure for the transfer chamber 300 in this case, even if the transfer chamber 300 is heated, the amount of air passing through the sealing structure is not significantly great and the affect due to pressure increase or the like is small. Due to this, as illustrated in FIG. 9, one sealing member 330 is sufficient to the transfer chamber 300 side, but the transfer chamber 300 may have the double sealing structure. The sealing member 330 is also composed of the same material of that of the first and second sealing members 230A and 230B.

According to the gate valve unit GV2 according to the modification example of the present embodiment, when the transfer chamber 300 is depressurized, the substrate transferring ports 203 and 404 at the process chamber 200B side are closed by the valve body 410. At this time, since the substrate transferring ports 303 and 406 at the transfer chamber 300 side are opened, the interior of the gate valve unit GV2 communicates with only the transfer chamber 300 via the substrate transferring ports 303 and 406.

Due to this, if the exhaust system 320 of the transfer chamber 300 is driven, even when the first and second sealing members 230A and 230B are heated and thus the sealing functions thereof are reduced and the air penetrates through the sealing member 230B, the air enters the gate valve unit GV2 through the communicating holes 408 and then flows into the transfer chamber 300 through the substrate transferring ports 303 and 406 to be exhausted by the exhaust system 320 of the transfer chamber 300 as illustrated in FIG. 10.

Like this, as the gap between the inner first sealing member 230A and the outer second sealing member 230B is actively vacuum-evacuated by the exhaust system 320 of the transfer chamber 300 through the communicating holes 408, although, for example, the air passes through the outer second sealing member 230B, the air does not pass through the first sealing member 230A, so that the air is prevented from entering the interior of the process chamber 200B required to maintain the high vacuum degree.

(Another Configuration Example of the Gate Valve Unit)

Figure 11:
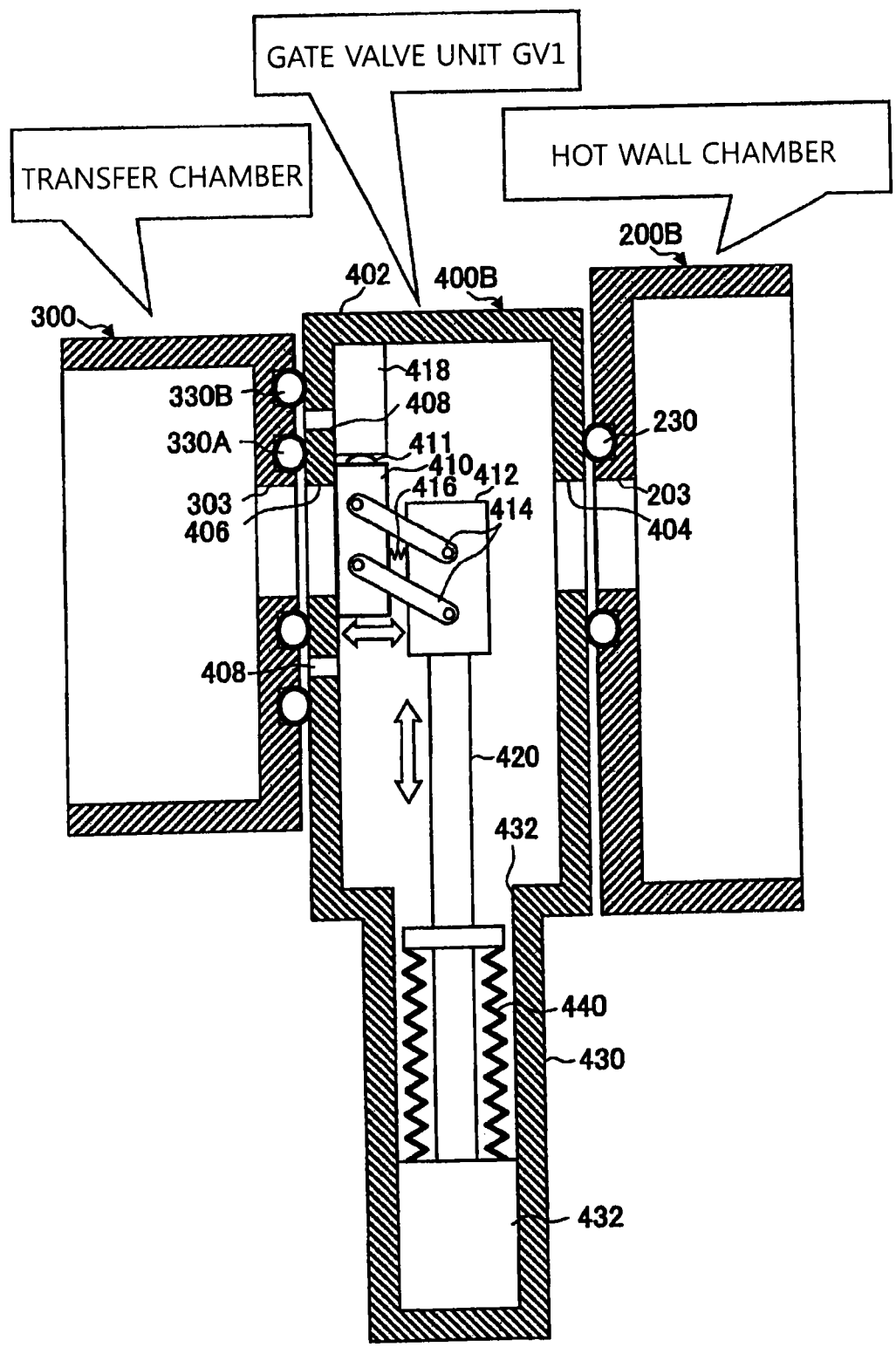
FIG. 11 is a cross-sectional view showing another configuration example of the gate valve unit GV1 according to the present embodiment.
Figure 12:
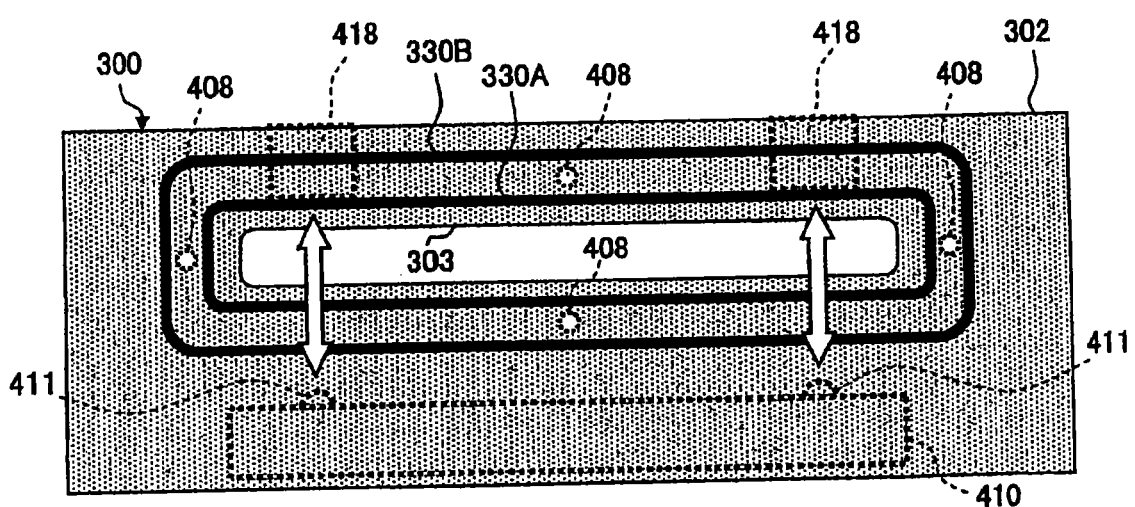
FIG. 12 is a front view of a connection surface with the gate valve unit GV1 in the transfer chamber shown in FIG. 11.

Next, another configuration example of the gate valve unit according to the present embodiment will be described with reference to the drawings. With regard to the gate valve unit GV1 used in the case which is intended to maintain the pressure in the transfer chamber 300 to the higher vacuum degree than that in the process chamber 200B, as an example, a case where the valve body driving part 432 is configured to enable the valve body 410 to perform only the elevating operation rather than the elevating operation and the opening and closing operation and is configured to enable the valve body 410 to perform the opening and closing operation by pressing the valve body 410 against the substrate transferring port 406 by a crank mechanism is shown. FIG. 11 is a cross-sectional view showing another configuration example of the gate valve unit GV1. FIG. 12 is a front view showing a connection surface with the gate valve unit GV1 in the transfer chamber 300.

The gate valve unit GV1 shown in FIG. 11 has a substantially box-shaped housing 402 made of, e.g., aluminum, and one sidewall of which is connected to the process chamber 200B and another sidewall of which is connected to the transfer chamber 300. In the housing 402, in order to pass through the loading and unlading wafers W, the substrate transferring ports 404 and 406 located at a position opposite to the substrate transferring ports 203 and 303 and having the almost same shape as that of the substrate transferring ports 203 and 303 are respectively provided in the sidewall of the transfer chamber 200B and the sidewall of the transfer chamber 300.

Furthermore, the sealing structures formed between each chamber 200B and 300 and the gate valve unit GV1 are the same as that shown in FIG. 6. That is, in this case, since the transfer chamber 300 is intended to be maintained at the higher vacuum degree than that of the process chamber 200B, although one sealing member 230 is provided between the process chamber 200B and the gate valve unit GV1, the first and second sealing member 330A and 330B may be provided between the transfer chamber 300 and the gate valve unit GV1 so as to thereby form a double sealing structure. The configurations of each sealing member 330A, 330B and 230 are the same as those shown in FIG. 6.

Further, in the sidewall of the housing 402 on the transfer chamber 300 side, the communicating holes 408 for allowing the gap between the first and second sealing members 330A and 330B to communicate with the internal space of the housing 402 are provided.

Here, the communicating holes 408 are disposed at, for example, positions shown in FIG. 12. That is, FIG. 12 shows that four circular communicating holes 408 are disposed vertically and horizontally between the first and second sealing members 330A and 330B. Further, the shape of the communicating holes 408 is not limited to that shown in FIG. 2, and the shape may be also a long hole or a slit. Further, the number of the communicating holes 408 is not limited to that shown in FIG. 12, but may be five or more, or three or below.

The gate valve unit GV1 shown in FIG. 11 opens and closes the substrate transferring ports 303 and 406 at the transfer chamber 300 side by elevating and reciprocating the valve body 410. When closing the substrate transferring port 406, the gate valve unit GV1 closes the substrate transferring port 406 while pressing against the substrate transferring port 406. Specifically, while bringing the valve body 410 into contact with a wall surface around the substrate transferring port 406, the gate valve unit GV1 closes the substrate transferring port 406 to seal.

Here, the valve body 410 is supported by a valve body supporting part 412 to be movable in a direction for which the substrate transferring port 406 is opened and closed by a link mechanism 414. Here, the valve body supporting part 412 is provided with a bias member 416 (for example, a spring) for biasing the valve body 410 in a direction spaced apart from the substrate transferring port 406.

The valve body supporting part 412 is configured to be elevatable while supporting the valve body 410 by the valve body driving part 432. Specifically, the valve body supporting part 412 is mounted to the tip of an elevatable elevating shaft 420, and a base end side of the elevating shaft 420 is connected to the valve body driving part 432 through the interior of an elevation guide frame 430 provided to protrude to a lower portion of the housing 402. The valve body driving part 432 includes, e.g., an actuator such as the pneumatic cylinder and is configured to elevate the elevating shaft 420.

Since the valve body driving part 432 becomes the contamination source of particle generation, there is a need to isolate it from the internal space of the housing 402 for which cleanliness is required. Due to this, the bellows 440 is disposed in the elevation guide frame 430 so as to cover the elevating shaft 420. Further, the bellows 440 includes, e.g., an airtight bellows-like member having corrosion resistance such as stainless or the like as the case shown in FIG. 6.

The bellows 440 is configured to be stretchable depending on an elevating operation. In this case, unlike the case shown in FIG. 6, the bellows 440 is configured such that an upper end thereof is mounted to the elevating shaft 420 and a lower end thereof is mounted to the valve body driving part 432. As a result, an external space of the bellows 440 communicates with the internal space of the housing 402 and is isolated from an internal space of the bellows 440.

In the housing 402 on the transfer chamber 300 side, a valve body restriction member 418 configured to regulate an elevating operation of the valve body 410 and guide the valve body 410 to the substrate transferring port 406 is provided at an upper portion near the side wall facing the transfer chamber 300. Also, the valve body restriction member 418 is partially provided at a position represented by dotted lines shown in FIG. 12 not to block the communicating holes 408. In FIG. 12, a case where two valve body restriction members 418 are provided at both sides of the upper communicating holes 408 is shown, but the present invention is not limited thereto.

Also, in an upper surface of the valve body 410, as illustrated in FIGS. 11 and 12, a buffer member 411 made of resin may be provided on a contact portion with the valve body restriction member 418. Thus, after being in contact with the valve body restriction member 418, the valve body 410 can be smoothly guided to the substrate transferring port 406.

Figure 13A:
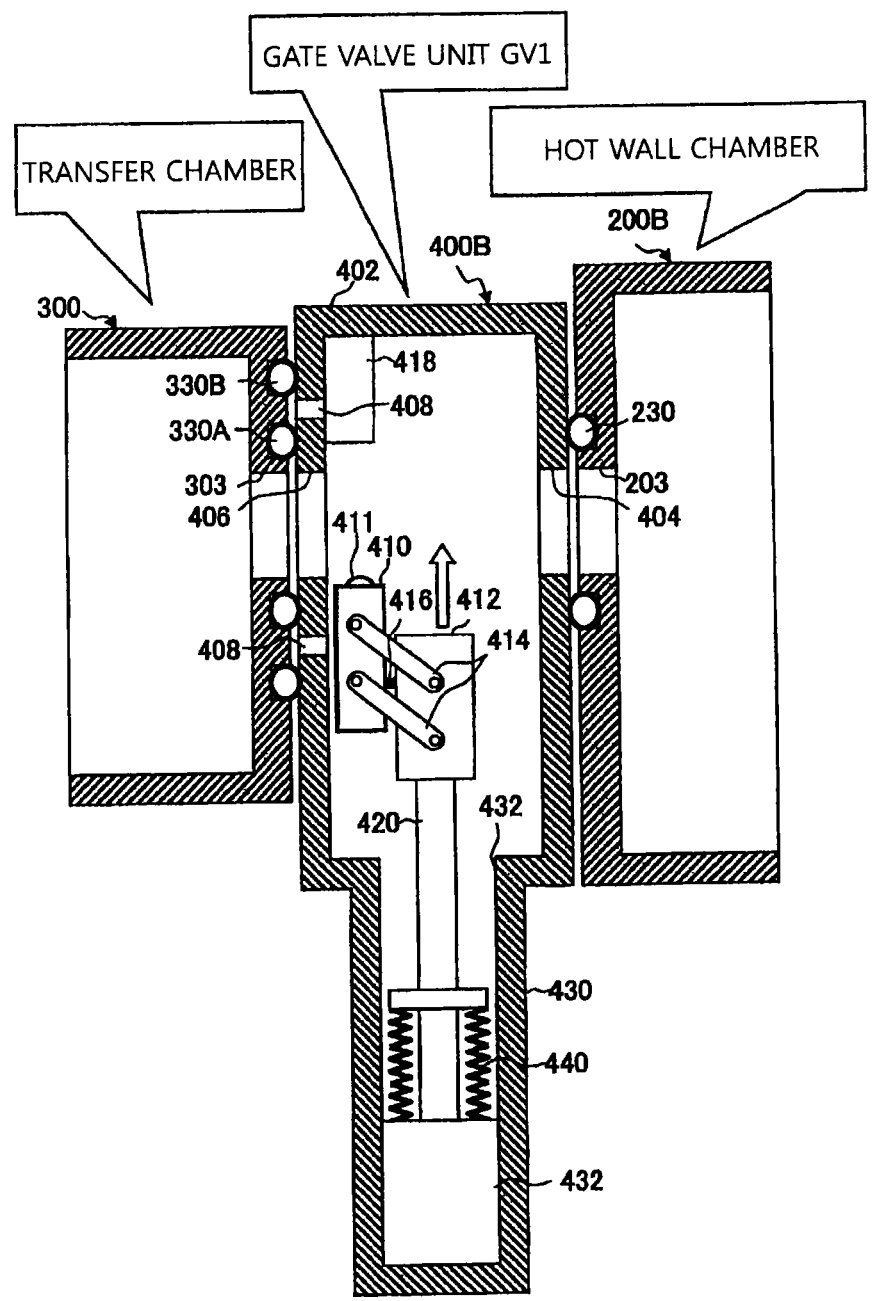
FIG. 13A is a view for explaining an operation of the gate valve unit GV1 shown in FIG. 11 and shows a case where a valve body descends to a standby position.
Figure 13B:
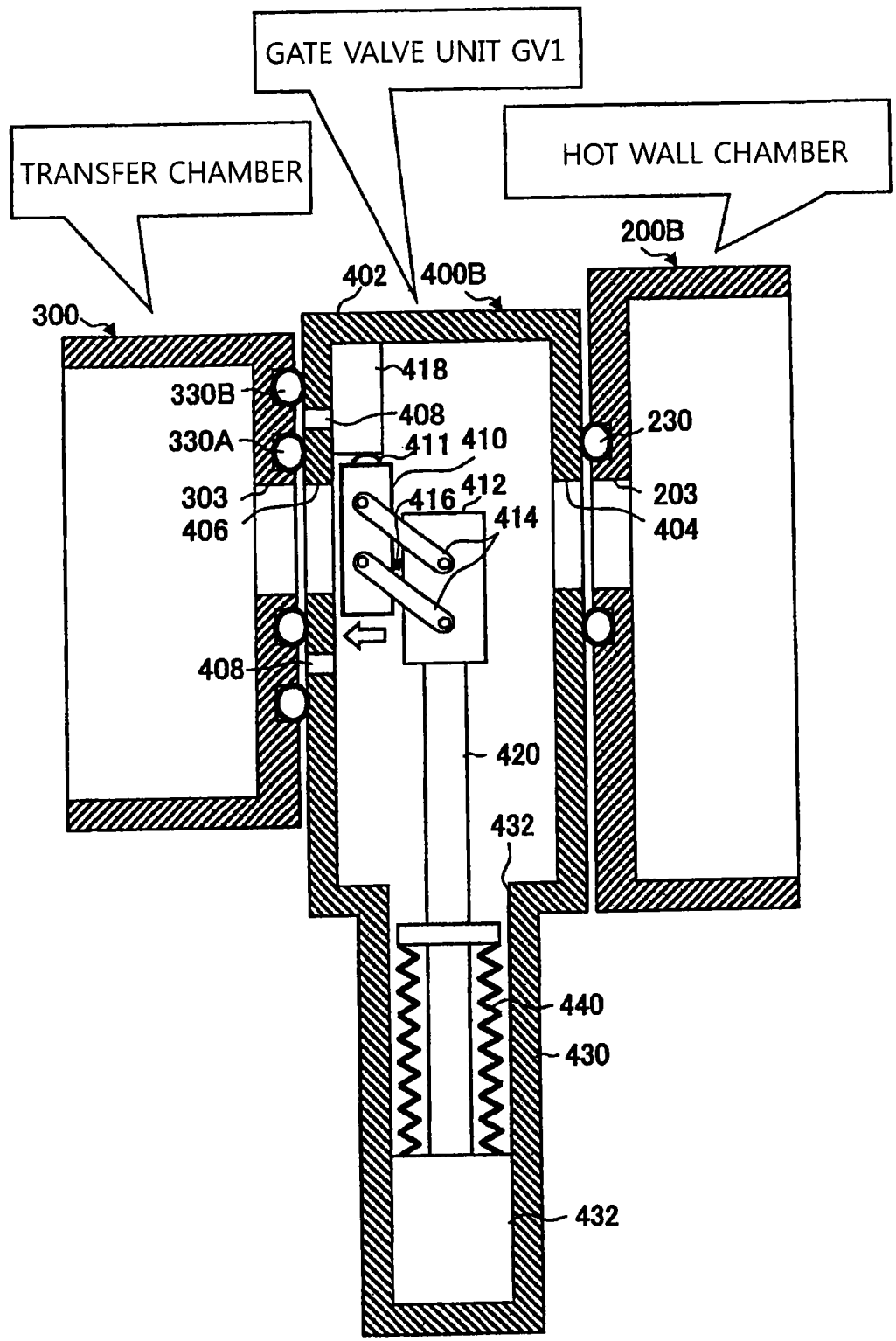
FIG. 13B is a view for explaining the operation of the gate valve unit GV1 shown in FIG. 11 and shows a case where the valve body ascends to come into contact with a valve body restriction member.
Figure 13C:
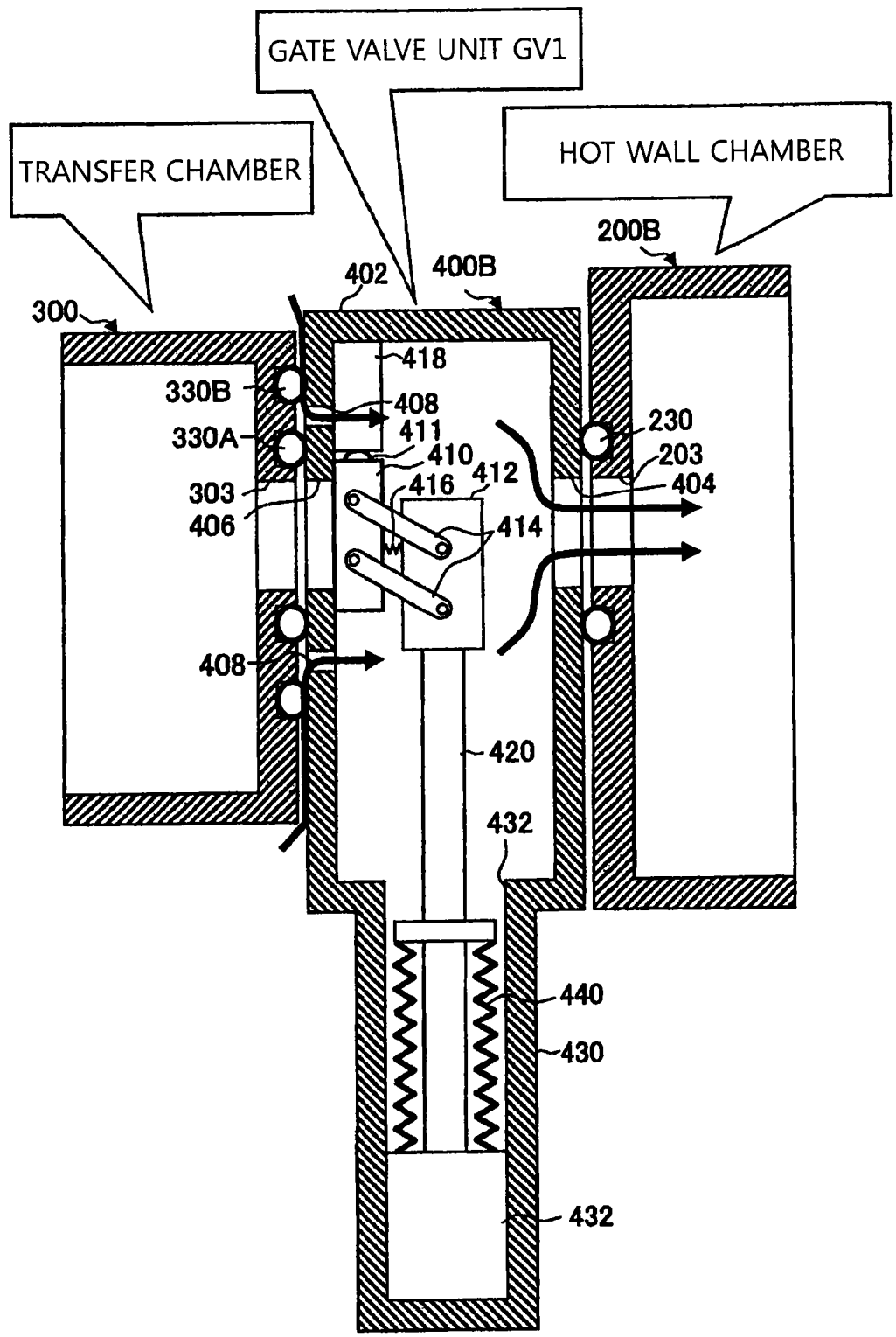
FIG. 13C is a view for explaining the operation of the gate valve unit GV1 shown in FIG. 11 and shows a case where the substrate transferring port is closed by the valve body.

Next, operations of the gate valve unit GV1 shown in FIG. 11 will be described with reference to the drawings. FIGS. 13A, 13B and 13C are views for explaining the operations of the gate valve unit GV1 shown in FIG. 11. FIG. 13A shows a case where the valve body 410 descends to a standby position. FIG. 13B shows a case where the valve body 410 ascends so as to come into contact with the valve body restriction member 418. FIG. 13C shows a case where the valve body 410 closes the substrate transferring port 406.

First, when the loading and unloading operations of the wafer W are performed under a state of the substrate transferring port 406 being open, as shown in FIG. 13A, the valve body 410 descends to the standby position where the transfer operation of the wafer W is not interrupted. Then, when the substrate transferring port 406 is closed, the valve body 410 ascends with the valve body supporting part 412 by elevating the elevating shaft 420.

Then, as illustrate in FIG. 13B, when the valve body 410 comes into contact with the valve body restriction member 418, the valve body 410 is restricted from further moving upwardly. Also, when the valve body supporting part 412 is moved upwardly, the valve body 410 is moved toward the substrate transferring port 406 against a biasing force of the bias member 416 by the link mechanism 414 and closes the substrate transferring port 406 at the transfer chamber 300 side as illustrated in FIG. 3C.

Then, when the transfer chamber 300 is depressurized up to the predetermined vacuum pressure, the valve body 410 closes the substrate transferring port 406. At this time, since the first and second sealing members 330A and 330B are heated by the heat transferred from the process chamber 200B to thereby reduce the sealing function thereof, as illustrated in FIG. 13C, although the air passes through the outer second sealing member 330B, the air neither passes through the inner first sealing member 330A nor enters the transfer chamber 300.

The air, which has passed through the outer second sealing member 330B, enters the gate valve unit GV1 through the communicating holes 408 and flows from the substrate transferring port 404 to the process chamber 200B to be exhausted by the exhaust system 220B of the process chamber 200B. Thus, the gap between the inner first sealing member 330A and the outer second sealing member 330B can be vacuum-evacuated by the exhaust system 220B of the process chamber 200B through the communicating holes 408.

In this way, the gate valve unit GV1 shown in FIG. 11 may be also configured such that, as shown in FIG. 6, although the air passes through, for example, the outer second sealing member 330B, the air can be prevented from entering the interior of the transfer chamber 300, thereby preventing the pressure in the transfer chamber 300 from increasing and enabling the predetermined vacuum pressure to be maintained.

Also, with regard to the gate valve unit GV1 shown in FIG. 11, the case where it is applied to the gate valve unit configured so as to close the substrate transferring port 406 by pressing the valve body 410 against the substrate transferring port 406 at the transfer chamber 300 side using the crank mechanism has been described, but the present invention is not limited thereto. For example, it may be also applied to the gate valve unit configured so as to close the substrate transferring port 406 by pressing the valve body 410 against the substrate transferring port 406 using a piston mechanism.

(Detailed Configuration Example of the Chamber to which the Gate Valve Unit is Applied)

Next, with regard to the substrate processing device 100 shown in FIG. 1, a detailed configuration example of the chamber to which the gate valve unit GV1 according to the present embodiment is applied will be described with reference to FIG. 14. Here, a case where the substrate processing device 100 shown in FIG. 1 is configured as a device for forming a CVD-Ru film used as an underlying layer of a Cu wiring on the wafer W is shown as an example.

Figure 14:
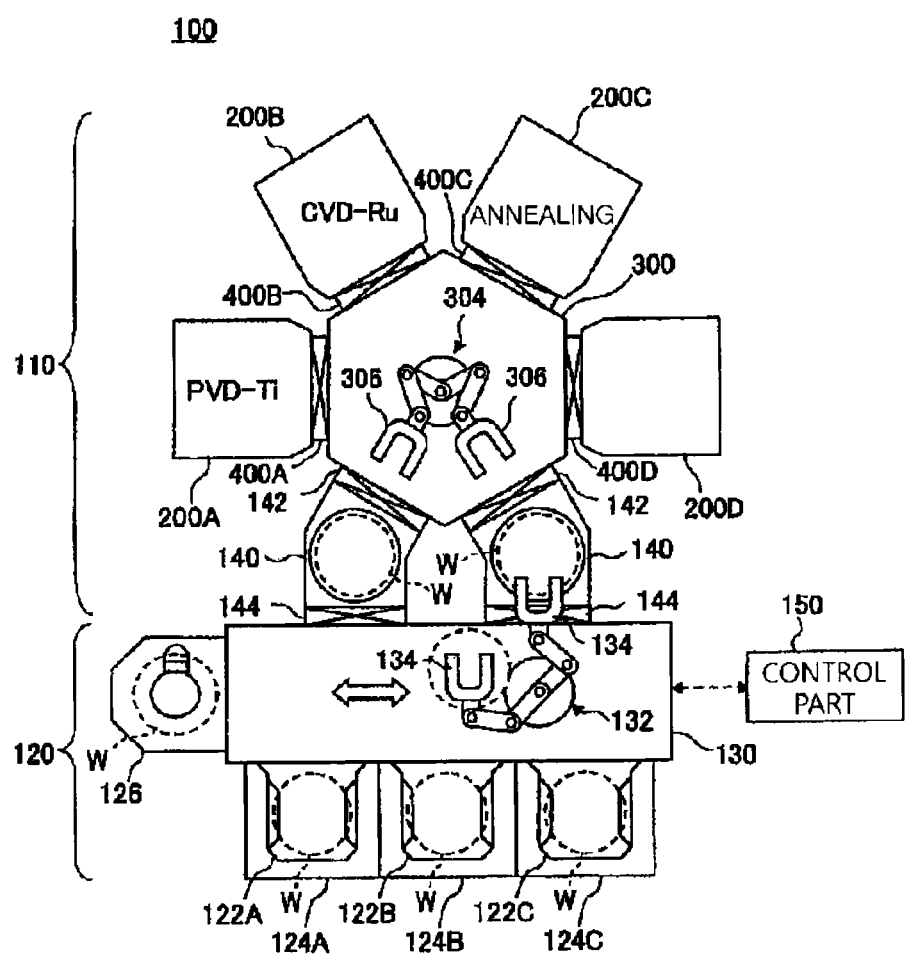
FIG. 14 is a view illustrating a specific example of a chamber configuration to which the gate valve unit GV1 according to the present embodiment is applied with regard to the substrate processing device 100 shown in FIG. 1.

The chambers shown in FIG. 14 are configured to have the functions as a PVD-Ti film forming chamber for forming a Ti film as a barrier film by the PVD process, a CVD-Ru film forming chamber for forming an underlying Ru film on the Ti film by the CVD process, and an annealing chamber for annealing the CVD-Ru film in a hydrogen containing atmosphere. Thus, the Ti film formation processing, CVD-Ru film formation processing and annealing processing may be consecutively performed until the film formation in a state in which the wafer W is not exposed to air.

Furthermore, the process chamber 200D may be configured in any way. For example, the process chamber 200D may be configured to have the function as the Cu film forming chamber for forming the Cu film on the CVD-Ru film after annealing. Thus, until the Cu film formation is completed, the processing may be consecutively performed without exposing the wafer W to the air.

Also, the process chamber 200D may be configured to have the function as a Cu seed film forming chamber for forming a Cu seed film on the CVD-Ru film. Thus, the process may be consecutively performed without exposing the wafer W to the air until the Cu seed film formation processing is completed. Then the wafer W may be transferred from the substrate processing unit 100 into a cassette container and a Cu plating process can be performed with a separate unit. Also, the configuration of the chamber is not limited to that shown in FIG. 1. Each function of the chambers may be assigned to any one of the process chambers 200A to 200D.

In the configuration of the chamber shown in FIG. 14, since the PVD-Ti film forming chamber needs a high vacuum degree of about $1\times10^{-8}$ Torr and uses the film forming gas (for example, $TiCl_4$ gas (being a liquid state at room temperature)) other than a solid for the wafer W at room temperature, the sidewall of the chamber can be cooled to a temperature of about 20° C. For this reason, the chamber belongs to a cold wall chamber having high vacuum degree.

Although the CVD-RU film forming chamber has a low vacuum degree of about $1\times10^{-6}$ Torr and processing is performed by heating the wafer W at a temperature of 150 to 250° C., the solid film forming gas is used at room temperature. Therefore, the sidewall of the chamber can not be cooled and may have a temperature of about 80° C. which is higher than the room temperature. Thus, the CVD-RU film forming chamber belongs to the hot wall chamber. Although the annealing chamber has a high pressure of 1.0~10 Torr, it carries out wafer processing by heating the wafer W at a high temperature of 150° C.~400° C. Thus, the annealing chamber belongs to a hot wall chamber.

Furthermore, since the transfer chamber 300 to which the chambers are connected is a chamber for which a high vacuum degree of about $1\times10^{-8}$ Torr and cleanliness are required, it is required to maintain the pressure of the transfer chamber 300 to a high vacuum degree.

Accordingly, although the gate valve 400A between the PVD-Ti film forming chamber and the transfer chamber 300 may be sufficiently configured of the gate valve unit GV0 (FIG. 3), gate valve units between the CVD-Ru film forming chamber and the transfer chamber 300 and between the annealing chamber and the transfer chamber 300 are configured of the gate valve unit GV1 (FIG. 6 or 11) according to the present embodiment. Thus, although the temperature of the process chamber 200B increases, the transfer chamber 300 may be maintained at the predetermined vacuum pressure.

Figure 15:
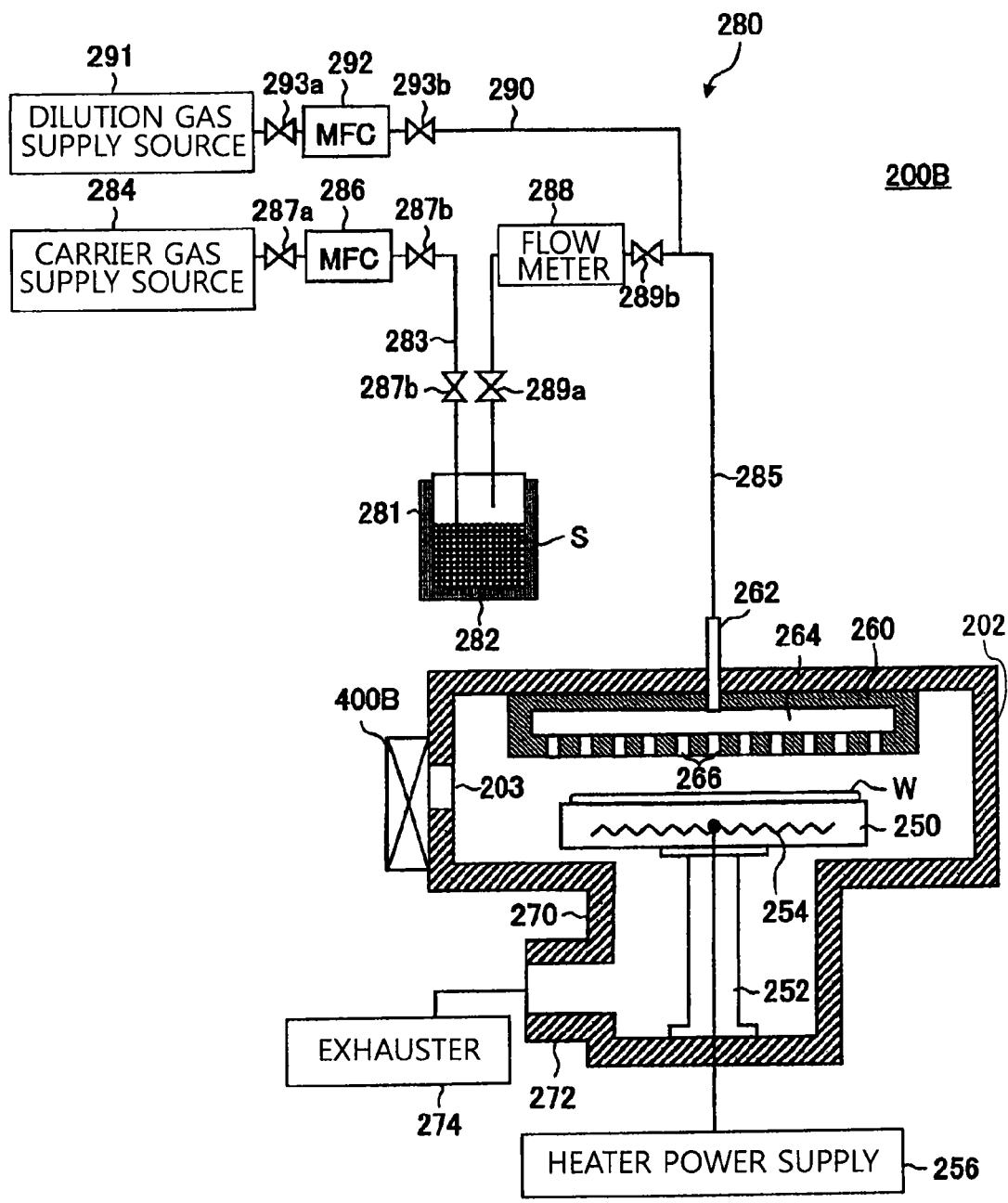
FIG. 15 is a cross-sectional view for explaining a schematic configuration of a CVD-Ru film forming chamber shown in FIG. 14.

As the hot wall chamber, the detailed configuration example of the CVD-Ru film forming chamber (process chamber 200B) shown in FIG. 14 will be described with reference to the FIG. 15. The CVD-Ru film forming chamber (process chamber 200B) has an airtightly formed cylindrical container 202, and in the interior of the container 202, a susceptor 250 for mounting the wafer W is disposed in a state of being supported by a cylindrical supporting member 252 provided in a lower portion of the center of the container 202.

A heater 254 is embedded in the susceptor 250, and a heater power supply 256 is connected to the heater 254. Further, the heater power supply 256 is controlled by a heater controller (not shown) on the basis of a detection signal of a thermo-couple (not shown) provided in the susceptor 250 so that the wafer W can be controlled to a predetermined temperature. Also, in the susceptor 250, three wafer elevating pins (not shown) for supporting and elevating the wafer W are provided to freely protrude and retract on a surface of the susceptor 250.

In a top wall of the container 202, a shower head 260 for introducing a predetermined gas for CVD film formation into the container 202 is provided to face the susceptor 250. The shower head 260 is configured to discharge the film forming gas supplied from a gas supply mechanism 280 to be described later into the container 202. A gas inlet 262 for introducing the film forming gas is provided in an upper portion of the shower head 260. Also, a gas diffusion space 264 is formed in the shower head 260 and a plurality of gas discharge holes 266 are formed on a bottom surface of the shower head 260.

An exhaust chamber 270 protruding downwardly is provided in a bottom wall of the container 202. An exhaust pipe 272 is connected to a side surface of the exhaust chamber 270, and an exhauster 274 having a vacuum pump and a pressure control valve or the like is connected to the exhaust pipe 272. Thus, the interior of the container 202 can be maintained at a predetermined vacuum pressure (for example, appropriately $1 \times 10^{-6}$ Torr) by operating the exhauster 274.

A gas supply mechanism 280 has a film forming raw material container 281 for containing ruthenium carbonyl ($Ru_3(CO)_{12}$) as a solid film forming raw material S at room temperature. A heater 282 is provided around the film forming raw material container 281. A carrier gas supply pipe 283 is inserted into the film forming raw material container 281 from above so that, for example, Co gas as carrier gas can be contained into the film forming raw material container 281 from the carrier gas supply source 284 through the carrier gas supply pipe 283.

Also, the gas supply pipe 285 is inserted into the film forming raw material container 281. The other end of the gas supply pipe 285 is connected to the gas inlet 262 of the shower head 260. Thus, as the carrier gas is supplied into the film forming raw material container 281 through the carrier gas supply pipe 283, under a state in which the ruthenium carbonyl ($Ru_3(CO)_{12}$) gas sublimated in the film forming raw material container 281 is returned to the carrier gas, the carrier gas can be supplied into the container 202 through the gas supply pipe 285 and the shower head 260.

The carrier gas supply pipe 283 is provided with a mass flow controller 286 for flow control and valves 287a and 287b provided at the front and back f the mass flow controller 286. Also, the gas supply pipe 285 is provided with a flow meter 288 for detecting an amount of the ruthenium carbonyl ($Ru_3(CO)_{12}$) gas and valves 289a and 289b provided at the front and back of the flow meter 288.

A dilution gas supply pipe 290 for supplying gas for appropriately diluting the film forming gas is connected in the route of the gas supply pipe 285. A dilution gas supply source 291 for supplying dilution gas composed of inert gas such as Ar gas, $N_2$ gas or the like is connected to the dilution gas supply pipe 290 so that the dilution gas can be supplied from the dilution gas supply source 291 through the dilution gas supply pipe 290, thereby enabling the raw material gas to be diluted to an appropriate concentration.

The dilution gas supplied from the dilution gas supply source 291 functions as purge gas for purging residual gas in the container 202. Also, the dilution gas supply pipe 290 has the mass flow controller 292 for flow control, and valves 293a and 293b provided at the front and back of the mass flow controller 292. Also, other gas such as CO gas, $H_2$ gas or the like may be separately connected to the dilution gas supply pipe 290.

In the CVD-Ru film forming chamber, a film formation process of the CVD-Ru film for the wafer W after forming the barrier film (the Ti film in this case) by the PVD-Ti film forming chamber is performed. The wafer W mounted on the susceptor 250 is heated by the heater 254 through the susceptor 250 at a temperature of 150° C. to 250° C. Then, the interior of the container 202 is exhausted by the vacuum pump of the exhauster 274 and is adjusted to a vacuum pressure of about $1 \times 10^{-6}$ Torr.

Next, the valves 287a and 287b open, and, for example, CO gas as the carrier gas is put into the film forming raw material container 281 through the carrier gas supply pipe 283, and the $Ru_3(CO)_{12}$ gas generated by sublimating due to heating of the heater 282 in the film forming raw material container 281 is introduced into the container 202 through the gas supply pipe 285 and the shower head 260 by the carrier gas.

At this time, in the surface of the wafer W, Ru generated by thermal decomposition of the $Ru_3(CO)_{12}$ gas is deposited on the Ti film of the wafer W so that the CVD-Ru film having a predetermined film thickness can be formed. Also, at this time, it is preferable that a flow rate of the $Ru_3(CO)_{12}$ gas is, for example, about 1 to 5 mL/min(sccm). Also, the dilution gas may be introduced at a predetermined ratio.

When the CVD-Ru film having the predetermined film thickness is formed on the wafer W, the valves 287a and 287b are closed so that the supply of the $Ru_3(CO)_{12}$ gas can be stopped, and as purge gas, the dilution gas is introduced from the dilution gas supply source 291 into the container 202, thereby purging the $Ru_3(CO)_{12}$ gas. Thus, the wafer W may be transferred from the container 202.

Figure 16:
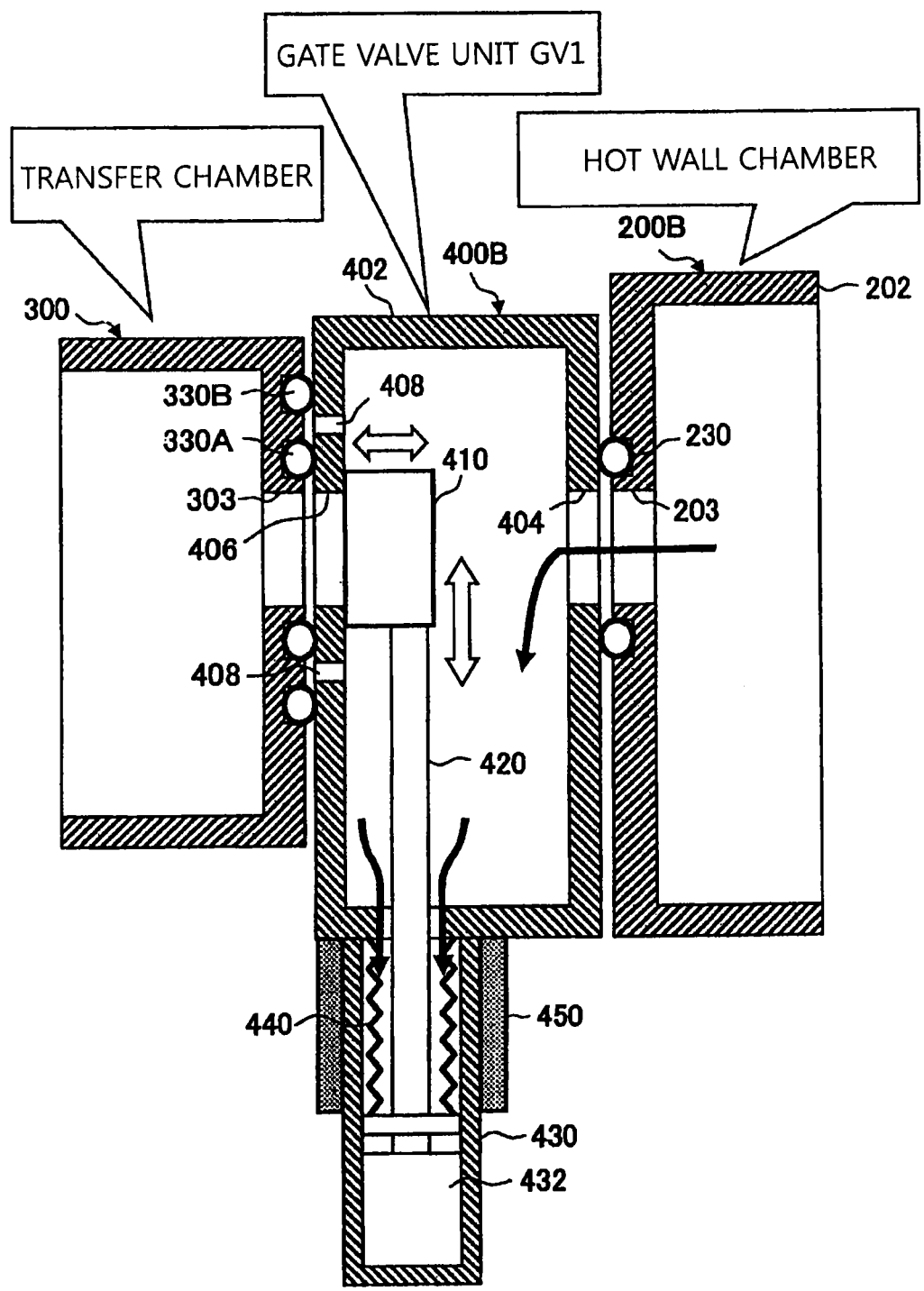
FIG. 16 is a cross-sectional view for explaining an operation of a case where the gate valve unit GV1 shown in FIG. 6 is applied to a gate valve 200B shown in FIG. 14 and shows a case where a bellows heater is further provided.

Meanwhile, in a case where the gate valve 400B connected to the CVD-Ru film forming chamber (process chamber 200B) is configured by the gate valve unit GV1 shown in FIG. 6, during a Ru film forming process, as illustrated in FIG. 16, the substrate transferring ports 303 and 406 at the transfer chamber 300 side are closed by the valve body 410. Due to this, during the Ru film forming process, the film forming gas ($Ru_3(CO)_{12}$ gas or the like in this case) can be prevented from entering the transfer chamber 300.

However, since the substrate transferring ports 203 and 404 at the process chamber 200B side are opened, as illustrated by arrows of FIG. 16, the film forming gas enters the interior of the gate valve unit GV1 through the substrate transferring ports 203 and 404, thereby causing such a problem that the gas may also enter the elevating guide frame 430.

At this time, since the bellows 440 is made of stainless steel or the like having low thermal conductivity compared to the housing 402 made of aluminum, a temperature of the bellows 440 may be easily reduced to a lower temperature than ambient temperatures. Therefore, in a case where the film forming gas such as the aforesaid $Ru_3(CO)_{12}$ gas in which the solid film forming raw material is sublimated at room temperature enters the elevating guide frame 430 (in this case, the inner side of the bellows 440), the film forming gas is cooled at a surface of the inner side of the bellows 440, thereby causing such a problem that the gas may be solidified to be adhered onto the surface. Like this, under a state in which an extraneous matter is adhered to the bellows 440, if the valve body 410 is lifted up, the extraneous matter is separated from the surface of the bellows 440 when the bellows 440 is stretched, thereby causing the generation of particles or mechanical failure.

In this case, for example, as illustrated in FIG. 16, a bellows heater 450 is provided to heat the bellows 440. As an example, FIG. 16 shows a case where the bellows heater 450 is provided around the elevation guide frame 430 to thereby heat the bellows 440. Accordingly, a reduction in temperature of the bellows 440 can be prevented by heating the bellows 440 using the bellows heater 450. Thus, although processing gas enters the elevation guide frame 430, the gas can be prevented from being attached to the surface of the bellows 440, thereby preventing the generation of particles.

Figure 17:
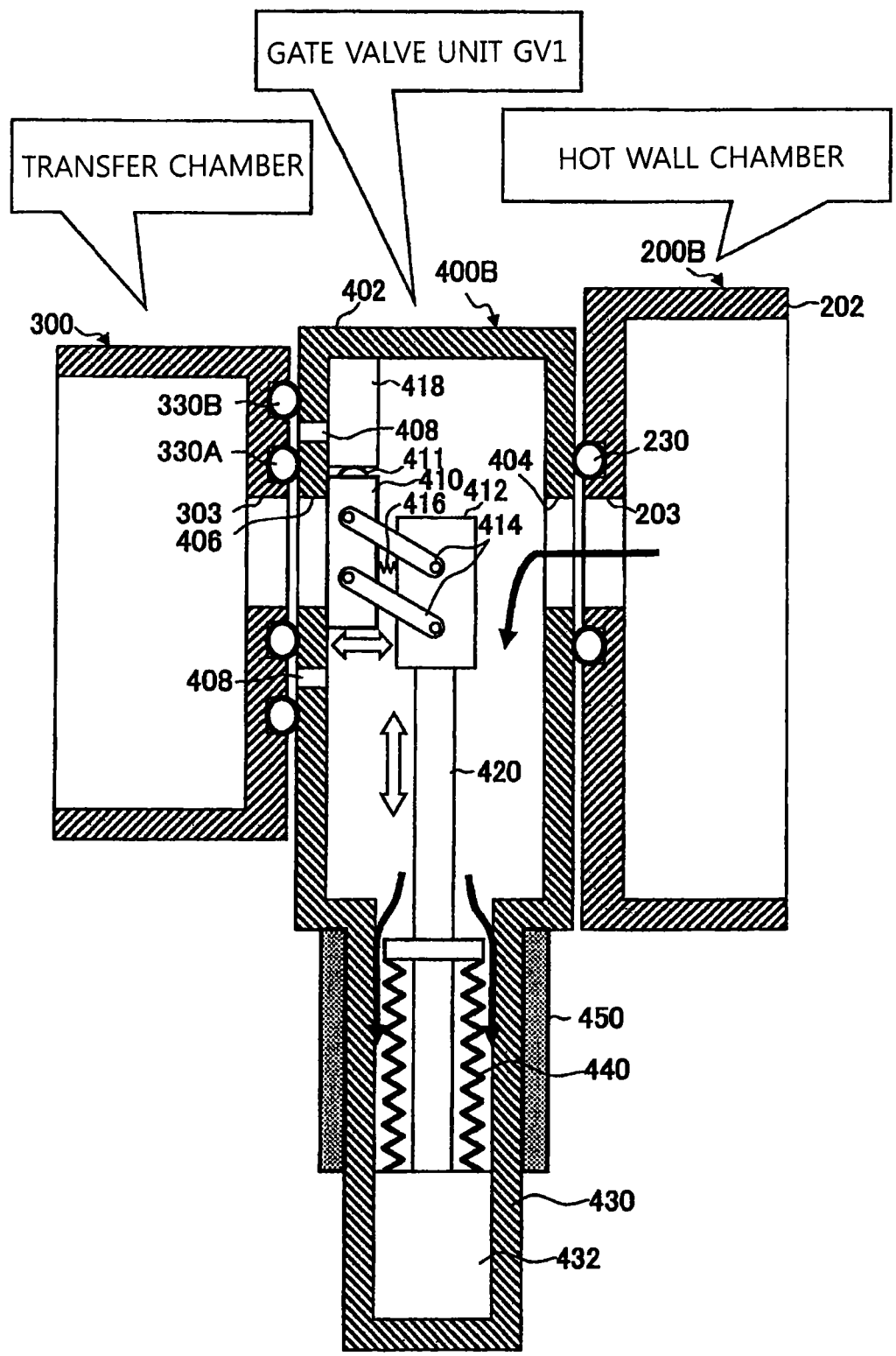
FIG. 17 is a cross-sectional view for explaining an operation of a case where the gate valve unit GV1 shown in FIG. 11 is applied to the gate valve 200B shown in FIG. 14 and shows a case where the bellows heater is further provided.

Also, even in the case where the gate valve 400B is configured by the gate valve unit GV1 shown in FIG. 11, the same problem may be generated. Specifically, as illustrated in FIG. 17, when the film forming gas enters an inside of the elevation guide frame 430 (in this case, an outer side of the bellows 440), the gas is cooled at a surface of the outer side of the bellows 440, thereby causing such a problem that the gas may be solidified to be adhered to the surface. In this case, for example, as illustrated in FIG. 17, the bellows heater 450 may be provided around the elevation guide frame 430.

The bellows heater 450 is not limited to the configuration as illustrated in FIGS. 16 and 17 wherein the bellows heater 450 heats the bellows 440 at the outer side of the bellows 440. The bellow heater 450 may be disposed at an inner side of the bellows 440.

Also, in a case where each load lock chamber 140 does not perform a processing process which enables a temperature to increase, the gate valves 142 shown in FIG. 1 or 14 between the transfer chamber 300 and each load lock chamber 140 are not required to be necessarily configured as the gate valve unit GV1 according to the present embodiment. In contrast, in a case where each load lock chamber 140 performs the processing process which enables the temperature to increase, it is preferable that the gate valves 142 are configured as the gate valve unit GV1 according to the present embodiment.

Industrial Applicability

The one embodiment of the present invention can be applied to the gate valve unit provided between the process chamber and the transfer chamber for performing a processing process for the substrate, the substrate processing device and a substrate processing method thereof.

While the present invention has been shown and described with respect to the preferred embodiments with reference to the drawings, but is not limited to the relevant embodiments. It will be understood by those skilled in the art that various changes and modifications may be made without departing from the scope of the invention as defined in the following claims. It will be understood that these changes and modifications also fall within the technical scope of the present invention.

This international application claims the priority of Japanese Patent Application No. 2011-061636 filed on Mar. 18, 2011, all contents of which are incorporated herein by reference.

DESCRIPTION OF REFERENCE SYMBOLS 100 substrate processing device
110 process module
120 loader module
122A~122C cassette container
124A~124C cassette seat
126 orientor
130 loader chamber
132 loader arm mechanism
134 loader arm
140 load lock chamber
142, 144 gate valve
150 control part
200A to 200D process chamber
202 container
203, 404 substrate transferring port
210A, 210B gas introduction system
212A, 212B gas supply source
214A, 214B mass flow controller
216A, 216B gas introduction valve
220A, 220B exhaust system
222A, 222B vacuum pump
224A, 224B Auto Pressure Controller
230 sealing member
250 susceptor
252 supporting member
254 heater
256 heater power supply
260 shower head
262 gas inlet
264 gas diffusion space
266 gas discharge hole
270 exhaust chamber
272 exhaust pipe
274 exhauster
280 gas supply mechanism
281 film forming raw material container
282 heater
283 carrier gas supply pipe
284 carrier gas supply source
285 gas supply pipe
286 mass flow controller
287a, 287b valve
288 flow meter
289a, 289b valve
290 dilution gas supply pipe
291 dilution gas supply source
292 mass flow controller
293a, 293b valve
300 transfer chamber
303, 406 substrate transferring port
304 transfer arm mechanism
306 transfer arm
310 gas introduction system
312 gas supply source
314 mass flow controller
316 gas inlet valve
320 exhaust system
322 vacuum pump
324 pressure regulating valve
330 sealing member
400A to 400D gate valve
402 housing
404, 406 substrate transferring port
408 communicating hole
410 valve body
411 buffer member
412 valve body supporting part
414 link mechanism
416 bias member
418 valve body restriction member
420 elevating shaft
430 elevation guide frame
432 valve body driving part
440 bellows
450 bellows heater
GV0 gate valve unit
GV1 gate valve unit
GV2 gate valve unit
W wafer

What is claimed is:

1. A substrate processing device, comprising:
a depressurizable hot wall chamber having a sidewall with a temperature which becomes higher than room temperature and a first substrate transferring port provided in the sidewall;
a depressurizable transfer chamber having a transfer arm mechanism for transferring a substrate to and from the hot wall chamber and a second substrate transferring port provided in a sidewall of the transfer chamber; and
a gate valve unit provided between the hot wall chamber and the transfer chamber, wherein the gate valve unit includes:
a housing having a sidewall provided with one or more communicating holes, a first housing substrate transferring port corresponding to the first substrate transferring port, and a second housing substrate transferring port corresponding to the second substrate transferring port;
a valve body which is movable up and down in the housing; and a double sealing structure having a first sealing member and a second sealing member provided at an outer side of the first sealing member, and
wherein said one or more communicating holes allow a gap between the first sealing member and the second sealing member to communicate with an internal space of the housing,
the first sealing member and the second sealing member are provided between the sidewall of the housing and the sidewall of one chamber among the hot wall chamber and the transfer chamber, which is required to maintain a higher vacuum degree than the other chamber among the hot wall chamber and the transfer chamber, and
the substrate transferring port of the one chamber is surrounded by the first sealing member and the second sealing member and is opened and closed by the valve body, and wherein the gap between the first sealing member and the second sealing member is vacuum-evacuated by the other chamber through said one or more communicating holes by depressurizing the other chamber under a state in which the substrate transferring port of the one chamber is closed by the valve body and the substrate transferring port of the other chamber is opened.

2. The substrate processing device of claim 1, wherein the gate valve unit further includes an elevating shaft mounted to the valve body, a bellows provided to cover a lower portion of the elevating shaft and configured to be stretchable depending on an elevating operation of the elevating shaft, and a bellows heater configured to heat the bellows.

3. The substrate processing device of claim 2, wherein the gate valve unit further includes a valve body restriction member disposed at a position not to block said one or more communicating holes; the valve body includes a main body and a valve body supporting part which supports the main body by a link mechanism and to which the elevating shaft is mounted, and
wherein the valve body restriction member restricts an elevating operation of the valve body at a position opposite to the substrate transferring port of the one chamber and moves the main body of the valve body in a direction to make the main body close the substrate transferring port of the one chamber through the link mechanism.

4. A substrate processing device, comprising:
a plurality of gate valve units;
a plurality of process chambers each being configured to perform a processing process for a substrate, wherein the process chambers include a depressurizable hot wall chamber having a sidewall with a temperature which becomes higher than room temperature and a first substrate transferring port provided in the sidewall; and
a depressurizable transfer chamber connected to each of the process chambers via one of the gate valve units and having a transfer arm mechanism configured to transfer the substrate to and from the process chambers and a second substrate transferring port,
wherein a gate valve unit placed between the hot wall chamber and the transfer chamber, has: a housing having a sidewall provided with one or more communicating holes, a first housing substrate transferring port corresponding to the first substrate transferring port and a second housing substrate transferring port corresponding to the second substrate transferring port; a valve body configured to be movable up and down in the housing; and a double sealing structure having a first sealing member and a second sealing member provided at an outer side of the first sealing member, said one or more communicating holes allow a gap between the first sealing member and the second sealing member to communicate with an internal space of the housing,
the first sealing member and the second sealing member are provided between a sidewall of the transfer chamber and the sidewall of the housing, and
the second substrate transferring port is surrounded by the first sealing member and the second sealing member and is opened and closed by the valve body, and
wherein the gap between the first sealing member and the second sealing member is vacuum-evacuated by the hot wall chamber through said one or more communicating holes by depressurizing the hot wall chamber under a state in which the second substrate transferring port is closed by the valve body and the first substrate transferring port is opened.

5. A substrate processing device, comprising:
a plurality of gate valve units;
a plurality of hot wall chambers, wherein each of the hot wall chambers has a sidewall with a temperature which becomes higher than room temperature and a first substrate transferring port provided in the sidewall and is configured to perform a processing process for a substrate; and
a depressurizable transfer chamber connected to each of the hot wall chambers via one of the gate valve units and having a transfer arm mechanism configured to transfer the substrate to and from the hot wall chambers and a second substrate transferring port provided in a sidewall of the transfer chamber,
wherein said one of the gate valve units has: a housing having a sidewall provided with one or more communicating holes, a first housing substrate transferring port corresponding to the first substrate transferring port of a hot wall chamber connected to said one of the gate valve units and a second housing substrate transferring port corresponding to the second substrate transferring port; a valve body configured to be movable up and down in the housing; and a double sealing structure having a first sealing member and a second sealing member provided at an outer side of the first sealing member,
said one or more communicating holes allow a gap between the first sealing member and the second sealing member to communicate with an internal space of the housing,
the first sealing member and the second sealing member are provided between the side wall of the housing and the sidewall of one chamber among the hot wall chamber and the transfer chamber, which is required to maintain a higher vacuum degree than the other chamber among the hot wall chamber and the transfer chamber, and
the substrate transferring port of the one chamber is surrounded by the first sealing member and the second sealing member and is opened and closed by the valve body
wherein the gap between the first sealing member and the second sealing member is vacuum-evacuated by the other chamber through said one or more communicating holes by depressurizing the other chamber under a state in which the substrate transferring port of the one chamber is closed by the valve body and the substrate transferring port of the other chamber is opened.

6. A gate valve unit, which is adapted to be provided between a depressurizable hot wall chamber, which has a sidewall with a temperature which becomes higher than room temperature and a first substrate transferring port provided in the sidewall, and a depressurizable transfer chamber having a transfer arm mechanism for transferring a substrate to and from the hot wall chamber and a second substrate transferring port provided in a sidewall of the transfer chamber, the gate valve unit comprising:
- a housing having a sidewall provided with one or more communicating holes, a first housing substrate transferring port corresponding to the first substrate transferring port, and a second housing substrate transferring port corresponding to the second substrate transferring port;
- a valve body configured to be movable up and down in the housing; and
- a double sealing structure having a first sealing member and a second sealing member provided at an outer side of the first sealing member,
- wherein said one or more communicating holes allow a gap between the first sealing member and the second sealing member to communicate with an internal space of the housing,
- the first sealing member and the second sealing member are provided between the sidewall of the housing and the sidewall of one chamber among the hot wall chamber and the transfer chamber, which is required to maintain a higher degree of vacuum than the other chamber among the hot wall chamber and the transfer chamber, and,
- the substrate transferring port of the one chamber is surrounded by the first sealing member and the second sealing member and is opened and closed by the valve body, and
- wherein the gap between the first sealing member and the second sealing member is vacuum-evacuated by the other chamber through said one or more communicating holes by depressurizing the other chamber under a state in which the substrate transferring port of the one chamber is closed by the valve body and the substrate transferring port of the other chamber is opened.

7. A substrate processing method using a substrate processing device comprising:
- a depressurizable hot wall chamber having a sidewall with a temperature which becomes higher than room temperature, and a first substrate transferring port provided in the sidewall; and
- a depressurizable transfer chamber having a transfer arm mechanism for transferring a substrate to and from the hot wall chamber and a second substrate transferring port provided in a sidewall of the transfer chamber; and
- a gate valve unit provided between the hot wall chamber and the transfer chamber, wherein the gate valve unit includes:
a housing having a sidewall provided with one or more communicating holes, a first housing substrate transferring port corresponding to the first substrate transferring port and a second housing substrate transferring port corresponding to the second substrate transferring port;
a valve body configured to be movable up and down in the housing; and
a double sealing structure having a first sealing member and a second sealing member provided at an outer side of the first sealing member, and
wherein said one or more communicating holes allow a gap between the first sealing member and the second sealing member to communicate with an internal space of the housing,
the first sealing member and the second sealing member are provided between the side wall of the housing and the sidewall of one chamber among the hot wall chamber and the transfer chamber, which is required to maintain a higher vacuum degree than the other chamber among the hot wall chamber and the transfer chamber, and
the substrate transferring port of the one chamber is surrounded by the first sealing member and the second sealing member, the method comprising:
depressurizing the other chamber so that the gap between the first sealing member and the second sealing member is vacuum-evacuated through said one or more communicating holes by the other chamber under a state in which the substrate transferring port of the one chamber is closed by the valve body and the substrate transferring port of the other chamber is opened.

* * * * *